United States Patent
Masuda

(10) Patent No.: US 8,829,579 B2
(45) Date of Patent: *Sep. 9, 2014

(54) SOLID-STATE IMAGING DEVICE, ELECTRONIC APPARATUS, AND METHOD FOR MANUFACTURING THE SAME

(71) Applicant: Sony Corporation, Tokyo (JP)

(72) Inventor: Yoshiaki Masuda, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/968,866

(22) Filed: Aug. 16, 2013

(65) Prior Publication Data

US 2013/0334642 A1 Dec. 19, 2013

Related U.S. Application Data

(60) Continuation of application No. 13/412,184, filed on Mar. 5, 2012, now Pat. No. 8,525,240, which is a division of application No. 12/656,385, filed on Jan. 28, 2010, now Pat. No. 8,148,761.

(30) Foreign Application Priority Data

Feb. 18, 2009 (JP) .................................. 2009-035761

(51) Int. Cl.
  *H01L 31/062* (2012.01)
  *H01L 27/148* (2006.01)
  *H01L 27/146* (2006.01)
  *H01L 31/0232* (2014.01)

(52) U.S. Cl.
  CPC ...... *H01L 31/0232* (2013.01); *H01L 27/14818* (2013.01); *H01L 27/1463* (2013.01); *H01L 27/14621* (2013.01); *H01L 27/14627* (2013.01)
  USPC ........... 257/292; 257/291; 257/293; 257/294; 257/432; 257/435

(58) Field of Classification Search
  CPC .............. H01L 27/14603; H01L 27/14605; H01L 27/14607; H01L 27/14609; H01L 27/1461; H01L 27/14623; H01L 27/14627; H01L 27/14643
  USPC .................. 257/292, 291, 293, 294, 432, 435
  See application file for complete search history.

(56) References Cited

U.S. PATENT DOCUMENTS 8,148,761 B2 * 4/2012 Masuda ........................ 257/292
8,525,240 B2 * 9/2013 Masuda ........................ 257/292

(Continued)

FOREIGN PATENT DOCUMENTS

JP  10-163462 A  6/1988
JP  07-050401 A  2/1995

(Continued)

*Primary Examiner* — Tan N Tran

(74) *Attorney, Agent, or Firm* — Rader, Fishman & Grauer PLLC

(57) ABSTRACT

A solid-state imaging device includes photoelectric conversion elements on an imaging surface of a substrate, receiving light incident on a light receiving surface and performing photoelectric conversion to produce a signal charge. Electrodes are interposed between the photoelectric conversion elements and light blocking portions are provided above the electrodes and interposed between the photoelectric conversion elements. The light blocking portions include an electrode light blocking portion formed to cover the corresponding electrode, and a pixel isolation and light blocking portion protruding convexly from the upper surface of the electrode light blocking portion. The photoelectric conversion elements are arranged at first pitches on the imaging surface. The electrode light blocking portions and the pixel isolation and light blocking portions are arranged at second and third pitches on the imaging surface. At least the third pitch increases with distance from the center toward the periphery of the imaging surface.

17 Claims, 28 Drawing Sheets

(56) References Cited

U.S. PATENT DOCUMENTS

2006/0231898 A1* 10/2006 Jeong et al. .................. 257/359
2007/0103572 A1* 5/2007 Yokozawa .................... 348/272

FOREIGN PATENT DOCUMENTS

| JP | 2001-189440 A | 7/2001 |
| JP | 2006-196553 A | 7/2006 |

* cited by examiner

US 8,829,579 B2

SOLID-STATE IMAGING DEVICE, ELECTRONIC APPARATUS, AND METHOD FOR MANUFACTURING THE SAME

CROSS REFERENCE TO RELATED APPLICATIONS

This is a continuation application of U.S. patent application Ser. No. 13/412,184, filed on Mar. 5, 2012, which is a divisional application of U.S. patent application Ser. No. 12/656,385, filed Jan. 28, 2010, now U.S. Pat. No. 8,148,761, issued on Apr. 3, 2012, which claims priority from Japanese Application No.: 2009-035761, filed on Feb. 18, 2009, the entire contents of which are incorporated herein by reference.

BACKGROUND OF THE INVENTION

1. Field of the Invention

The present invention relates to a solid-state imaging device, an electronic apparatus, and a method for manufacturing the same.

2. Description of the Related Art

A digital video camcorder, a digital still camera, or any other similar electronic apparatus includes a solid-state imaging device. The solid-state imaging device is, for example, a CCD (Charge Coupled Device) image sensor.

For example, a CCD image sensor has an imaging region provided on a substrate. The imaging region has a plurality of pixels arranged in the horizontal and vertical directions and forming a matrix. In the imaging region, a plurality of photoelectric conversion elements, which receives subject image light and produces signal charges, is formed in correspondence with the plurality of pixels. For example, photodiodes are formed as the photoelectric conversion elements.

Vertical transfer registers are provided between columns formed of the plurality of photoelectric conversion elements arranged in the vertical direction in the imaging region. Each of the vertical transfer registers has a plurality of transfer electrodes facing a vertical transfer channel region via a gate insulating film and transfers in the vertical direction the signal charges read from the corresponding photoelectric conversion elements through charge readout portions. A horizontal transfer register then sequentially transfers in the horizontal direction the signal charges having been transferred for each horizontal line (a row of pixels) through the corresponding vertical transfer resister, and an output section outputs the signal charges (see JP-A-7-50401, for example).

In the solid-state imaging device described above, electrode light blocking films that block light incident on the vertical transfer resisters are provided in the imaging region in order to prevent smear or other problems.

Further, a variety of techniques have been proposed to prevent shading, color mixing, and other problems from occurring in a captured image (see JP-A-7-50401, JP-A-10-163462, JP-A-2006-196553, and JP-A-2001-189440, for example).

SUMMARY OF THE INVENTION

A solid-state imaging device and other similar devices are typically required to be reduced in size. As a result, among a plurality of pixels arranged in the imaging region of a solid-state imaging device, pixels positioned in the periphery of the imaging region receive incident light inclined to the direction perpendicular to the imaging region, and the inclination angle increases as the size of the imaging device decreases. That is, the angle of incidence at both ends of the angle of view increases as the size of the imaging device decreases.

It is therefore sometimes difficult to sufficiently suppress shading, color mixing, and other problems, resulting in decrease in image quality of a captured image in some cases.

Thus, it is desirable to provide a solid-state imaging device, an electronic apparatus, and a method for manufacturing the same capable of improving the image quality of a captured image.

A solid-state imaging device according to an embodiment of the invention includes a plurality of photoelectric conversion elements disposed on an imaging surface of a substrate, each of the photoelectric conversion elements receiving light incident on a light receiving surface and performing photoelectric conversion to produce a signal charge, a plurality of electrodes interposed between the photoelectric conversion elements arranged on the imaging surface of the substrate, and a plurality of light blocking portions provided above the plurality of electrodes and interposed between the photoelectric conversion elements arranged on the imaging surface of the substrate. Each of the light blocking portions includes an electrode light blocking portion formed to cover the corresponding electrode, and a pixel isolation and light blocking portion protruding convexly from the upper surface of the electrode light blocking portion. The plurality of photoelectric conversion elements are arranged at first pitches on the imaging surface. The electrode light blocking portions in the plurality of light blocking portions are arranged at second pitches on the imaging surface. The pixel isolation and light blocking portions in the plurality of light blocking portions are arranged at third pitches on the imaging surface. At least the third pitch increases with distance from the center toward the periphery of the imaging surface.

A solid-state imaging device according to another embodiment of the invention includes a plurality of photoelectric conversion elements disposed on an imaging surface of a substrate, each of the photoelectric conversion elements receiving light incident on a light receiving surface and performing photoelectric conversion to produce a signal charge, a plurality of electrodes interposed between the photoelectric conversion elements arranged on the imaging surface of the substrate, and a plurality of light blocking portions provided above the plurality of electrodes and interposed between the photoelectric conversion elements arranged on the imaging surface of the substrate. Each of the light blocking portions includes an electrode light blocking portion formed to cover the corresponding electrode, and a pixel isolation and light blocking portion protruding convexly from the upper surface of the electrode light blocking portion. The photoelectric conversion elements, the electrode light blocking portions, and the pixel isolation and light blocking portions are disposed at the same pitches on the imaging surface. The pixel isolation and light blocking portions are formed in such a way that the width in between the plurality of photoelectric conversion elements decreases with distance from the center toward the periphery of the imaging surface.

A solid-state imaging device according to still another embodiment of the invention includes a plurality of photoelectric conversion elements disposed on an imaging surface of a substrate, each of the photoelectric conversion elements receiving light incident on a light receiving surface and performing photoelectric conversion to produce a signal charge, a plurality of electrodes interposed between the photoelectric conversion elements arranged on the imaging surface of the substrate, and a plurality of light blocking portions provided above the plurality of electrodes and interposed between the photoelectric conversion elements arranged on the imaging surface of the substrate. Each of the light blocking portions includes an electrode light blocking portion formed to cover the corresponding electrode, and a pixel isolation and light blocking portion protruding convexly from the upper surface of the electrode light blocking portion. The plurality of pixel isolation and light blocking portions are formed in such a way that the width of the spaces between the plurality of pixel isolation and light blocking portions increases with distance from the center toward the periphery of the imaging surface.

An electronic apparatus according to yet another embodiment of the invention includes a plurality of photoelectric conversion elements disposed on an imaging surface of a substrate, each of the photoelectric conversion elements receiving light incident on a light receiving surface and performing photoelectric conversion to produce a signal charge, a plurality of electrodes interposed between the photoelectric conversion elements arranged on the imaging surface of the substrate, and a plurality of light blocking portions provided above the plurality of electrodes and interposed between the photoelectric conversion elements arranged on the imaging surface of the substrate. Each of the light blocking portions includes an electrode light blocking portion formed to cover the corresponding electrode, and a pixel isolation and light blocking portion protruding convexly from the upper surface of the electrode light blocking portion. The plurality of photoelectric conversion elements are arranged at first pitches on the imaging surface. The electrode light blocking portions in the plurality of light blocking portions are arranged at second pitches on the imaging surface. The pixel isolation and light blocking portions in the plurality of light blocking portions are arranged at third pitches on the imaging surface. At least the third pitch increases with distance from the center toward the periphery of the imaging surface.

A method for manufacturing a solid-state imaging device according to still yet another embodiment of the invention includes the steps of forming a plurality of photoelectric conversion elements on an imaging surface of a substrate, each of the photoelectric conversion elements receiving light incident on a light receiving surface and performing photoelectric conversion to produce a signal charge, forming a plurality of electrodes interposed between the plurality of photoelectric conversion elements arranged on the imaging surface of the substrate, and forming a plurality of light blocking portions above the plurality of electrodes and between the plurality of photoelectric conversion elements arranged on the imaging surface of the substrate. The step of forming the light blocking portions includes the steps of forming an electrode light blocking portion that covers the corresponding electrode, and forming a pixel isolation and light blocking portion protruding convexly from the upper surface of the electrode light blocking portion. In the step of forming the photoelectric conversion elements, the plurality of photoelectric conversion elements are arranged at first pitches on the imaging surface. In the step of forming the electrode light blocking portions, the electrode light blocking portions are arranged at second pitches on the imaging surface. In the step of forming the pixel isolation and light blocking portions, the pixel isolation and light blocking portions are arranged at third pitches on the imaging surface and the third pitch increases with distance from the center toward the periphery of the imaging surface.

In the embodiments of the invention, each of the light blocking portions is formed to include an electrode light blocking portion that covers the corresponding electrode and a pixel isolation and light blocking portion protruding convexly from the upper surface of the electrode light blocking portion. The pixel isolation and light blocking portions are formed in such a way that the width of the spaces between the pixel isolation and light blocking portions increases with distance from the center toward the periphery of the imaging surface.

According to the embodiments of the invention, a solid-state imaging device, an electronic apparatus, and a method for manufacturing the same capable of improving the image quality of a captured image can be provided.

DESCRIPTION OF THE PREFERRED EMBODIMENTS

Embodiments of the invention will be described below with reference to the drawings.

The description will be made in the following order.

1. First embodiment (all pitches and light receiving area increase with distance from center toward periphery)
2. Second embodiment (pitches at which pixel isolation and light blocking portions are disposed increase with distance from center toward periphery)
3. Third embodiment (the width of pixel isolation and light blocking portion decreases with distance from center toward periphery)
4. Fourth embodiment (color filter is formed as plano-convex lens whose lower side is convex surface)
5. Fifth embodiment (color filter is formed as light guide (air gap))
6. Sixth embodiment (color filter is formed as light guide (oxide film))
7. Seventh embodiment (the thickness of on-chip lens increases with distance from center toward periphery)
8. Others

1. First Embodiment

Device Configuration (1) Overall Configuration of Camera

Figure 1:
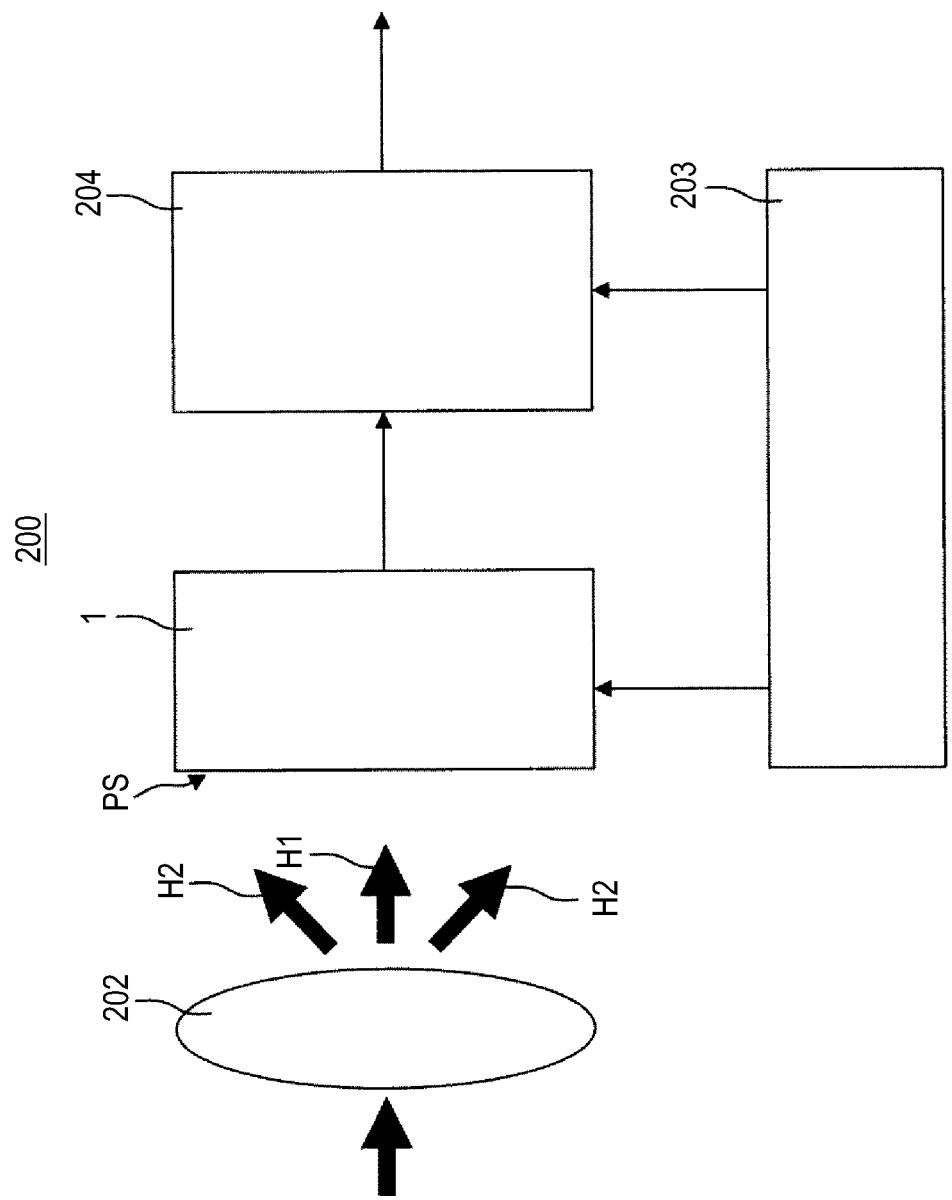
FIG. 1 is a configuration diagram showing the configuration of a camera in a first embodiment according to the invention.

FIG. 1 is a configuration diagram showing the configuration of a camera 200 in a first embodiment according to the invention.

As shown in FIG. 1, the camera 200 includes a solid-state imaging device 1, an optical system 202, a drive circuit 203, and a signal processing circuit 204.

The solid-state imaging device 1 captures the light (subject image) that passes through the optical system 202 and impinges on an imaging surface PS, produces a signal charge, and outputs the signal charge as raw data. The configuration of the solid-state imaging device 1 will be described later in detail.

The optical system 202 includes an optical lens or any other suitable component and focuses the subject image on the imaging surface PS of the solid-state imaging device 1.

Specifically, a principal ray H1 exits through the optical system 202 and impinges on a central portion of the imaging surface PS of the solid-state imaging device 1 at right angles, as shown in FIG. 1. On the other hand, a principal ray H2 exits through the optical system 202 and impinges on a peripheral portion of the imaging surface PS at an angle inclined to the direction perpendicular to the imaging surface PS. Since the exit pupil of the optical system 202 is positioned at a finite distance, the inclination of the principal ray H2 directed toward the imaging surface PS of the solid-state imaging device 1 increases with distance from the center toward the periphery.

The drive circuit 203 outputs a variety of drive signals to the solid-state imaging device 1 and the signal processing circuit 204 to drive the solid-state imaging device 1 and the signal processing circuit 204.

The signal processing circuit 204 performs signal processing on the raw data outputted from the solid-state imaging device 1 to produce a digitized subject image.

(2) Overall Configuration of Solid-State Imaging Device

Figure 2:
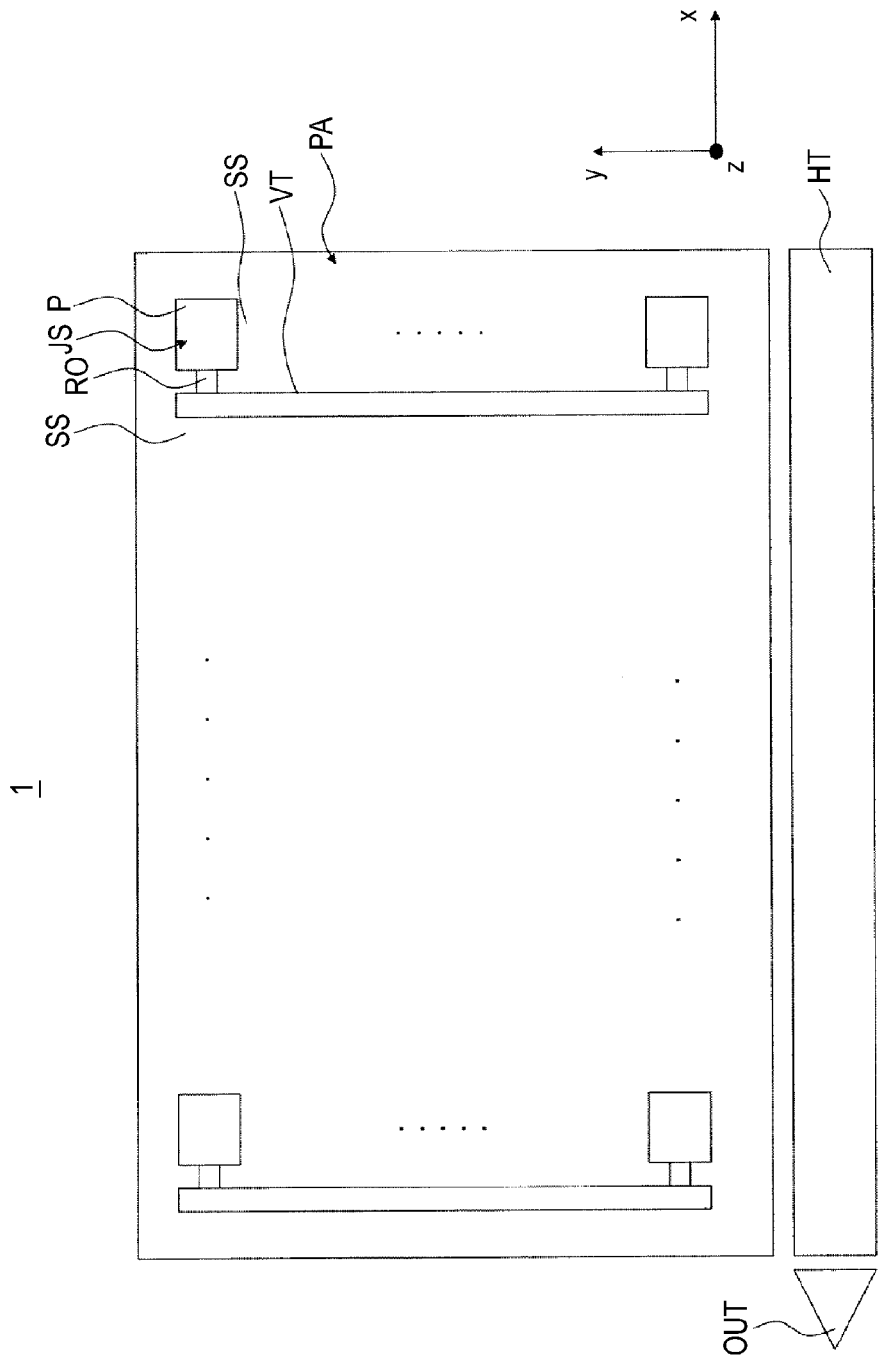
FIG. 2 is a plan view schematically showing an overall configuration of a solid-state imaging device in the first embodiment according to the invention.

FIG. 2 is a plan view schematically showing an overall configuration of the solid-state imaging device 1 in the first embodiment according to the invention.

As shown in FIG. 2, the solid-state imaging device 1 is, for example, an interline CCD image sensor and captures a subject image on an imaging region PA.

Photoelectric converters P, charge readout portions R0, and vertical transfer registers VT are formed in the imaging region PA, as shown in FIG. 2.

A plurality of photoelectric converters P are provided in the imaging region PA and arranged in the horizontal direction x and the vertical direction y to form a matrix, as shown in FIG. 2. That is, a plurality of pixels that captures a subject image are arranged in a matrix. An element isolator SS is provided around each of the plurality of photoelectric converters P so that the photoelectric converter P is isolated from the others. Each of the photoelectric converters P has a light receiving surface JS that receives subject image light and performs photoelectric conversion to produce a signal charge.

A plurality of charge readout portions R0 are provided in the imaging region PA in correspondence with the plurality of photoelectric converters P, as shown in FIG. 2. Each of the charge readout portions R0 reads the signal charge produced by the corresponding photoelectric converter P and outputs it to the corresponding vertical transfer register VT.

The vertical transfer registers VT extend in the imaging region PA in the vertical direction y in correspondence with the plurality of photoelectric converters P arranged in the vertical direction y, as shown in FIG. 2. Further, the vertical transfer registers VT are disposed between the columns formed of the plurality of photoelectric converters P arranged in the vertical direction y. The plurality of vertical transfer registers VT, which are provided in the imaging region PA, are arranged in the horizontal direction x in correspondence with the plurality of photoelectric converters P arranged in the horizontal direction x. Each of the vertical transfer registers VT is what is called a vertical transfer CCD, reads signal charges from the corresponding photoelectric converters P through the corresponding charge readout portions R0, and sequentially transfers the signal charges in the vertical direction y. Each of the vertical transfer registers VT, which will be described later in detail, has a plurality of transfer electrodes (not shown) arranged in the vertical direction y, and the transfer electrodes arranged in the vertical direction sequentially receive four-phase drive pulse signals to transfer the signal charges.

A horizontal transfer register HT is disposed in a lower end portion of the imaging region PA, as shown in FIG. 2. The horizontal transfer register HT extends in the horizontal direction x and sequentially transfers in the horizontal direction x the signal charges transferred in the vertical direction y by each of the plurality of the vertical transfer registers VT. That is, the horizontal transfer register HT is what is called a horizontal transfer CCD and driven, for example, by a two-phase drive pulse signal to transfer the signal charges having been transferred for each horizontal line (a row of pixels).

An output section OUT is formed at the left end of the horizontal transfer register HT, as shown in FIG. 2. The output section OUT converts the signal charges having been transferred in the horizontal direction by the horizontal transfer register HT into voltages, and outputs the voltages as an analog image signal.

The imaging region PA described above corresponds to the imaging surface PS shown in FIG. 1.

(3) Detailed Configuration of Solid-State Imaging Device

The configuration of the solid-state imaging device 1 will be described in detail.

Figure 3:
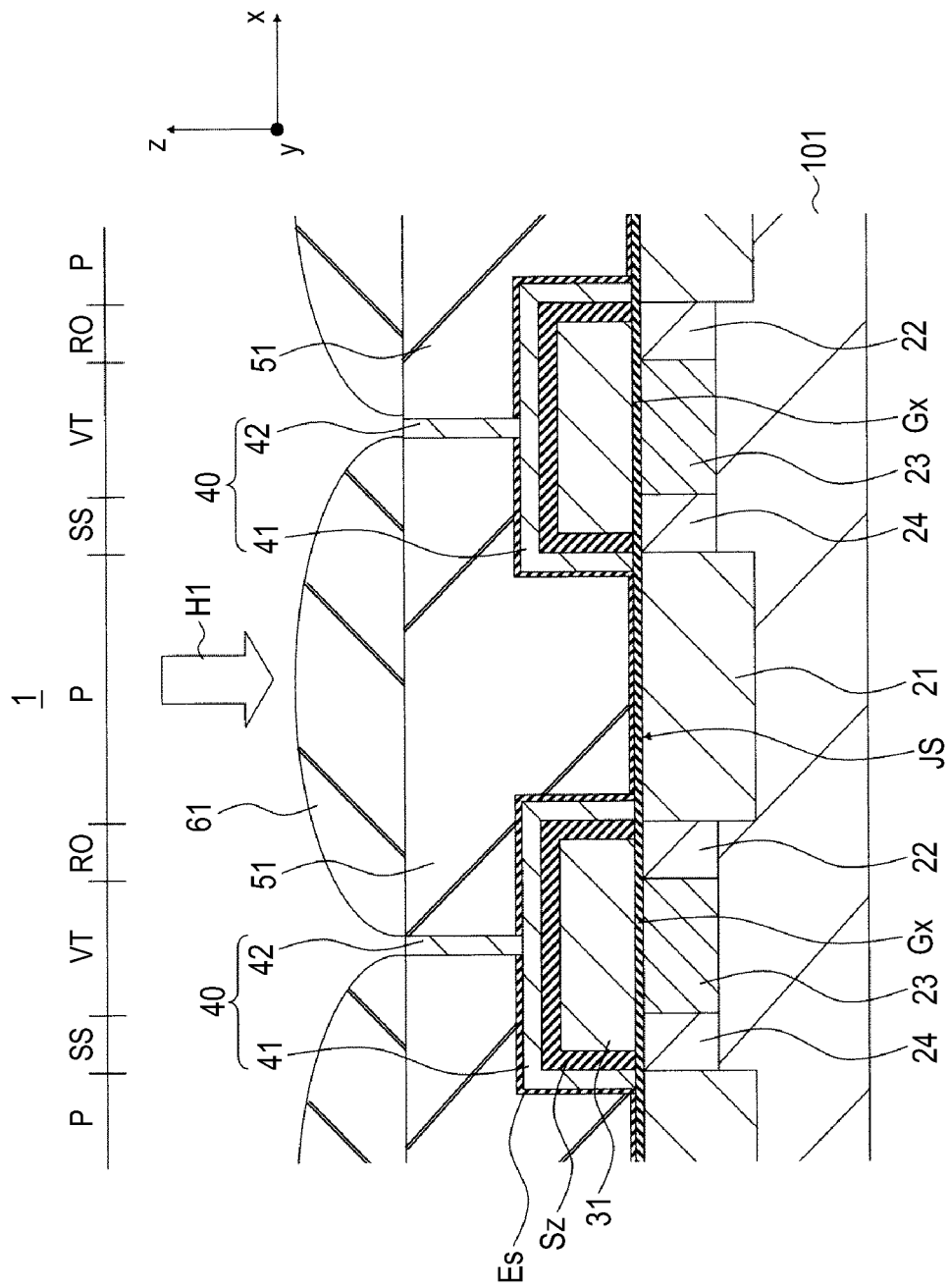
FIG. 3 shows a key portion of the solid-state imaging device in the first embodiment according to the invention.
Figure 4:
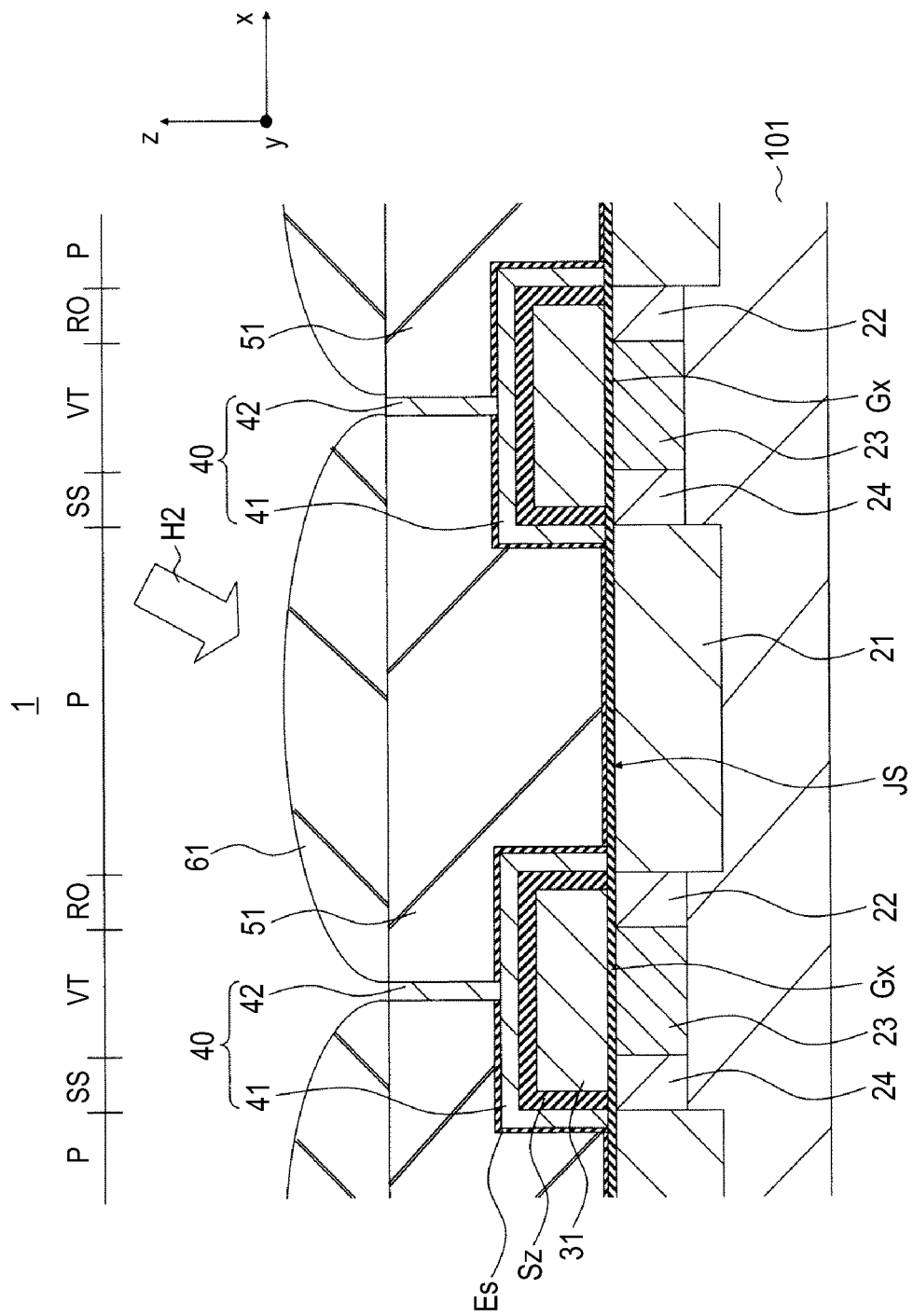
FIG. 4 shows another key portion of the solid-state imaging device in the first embodiment according to the invention.
Figure 5:
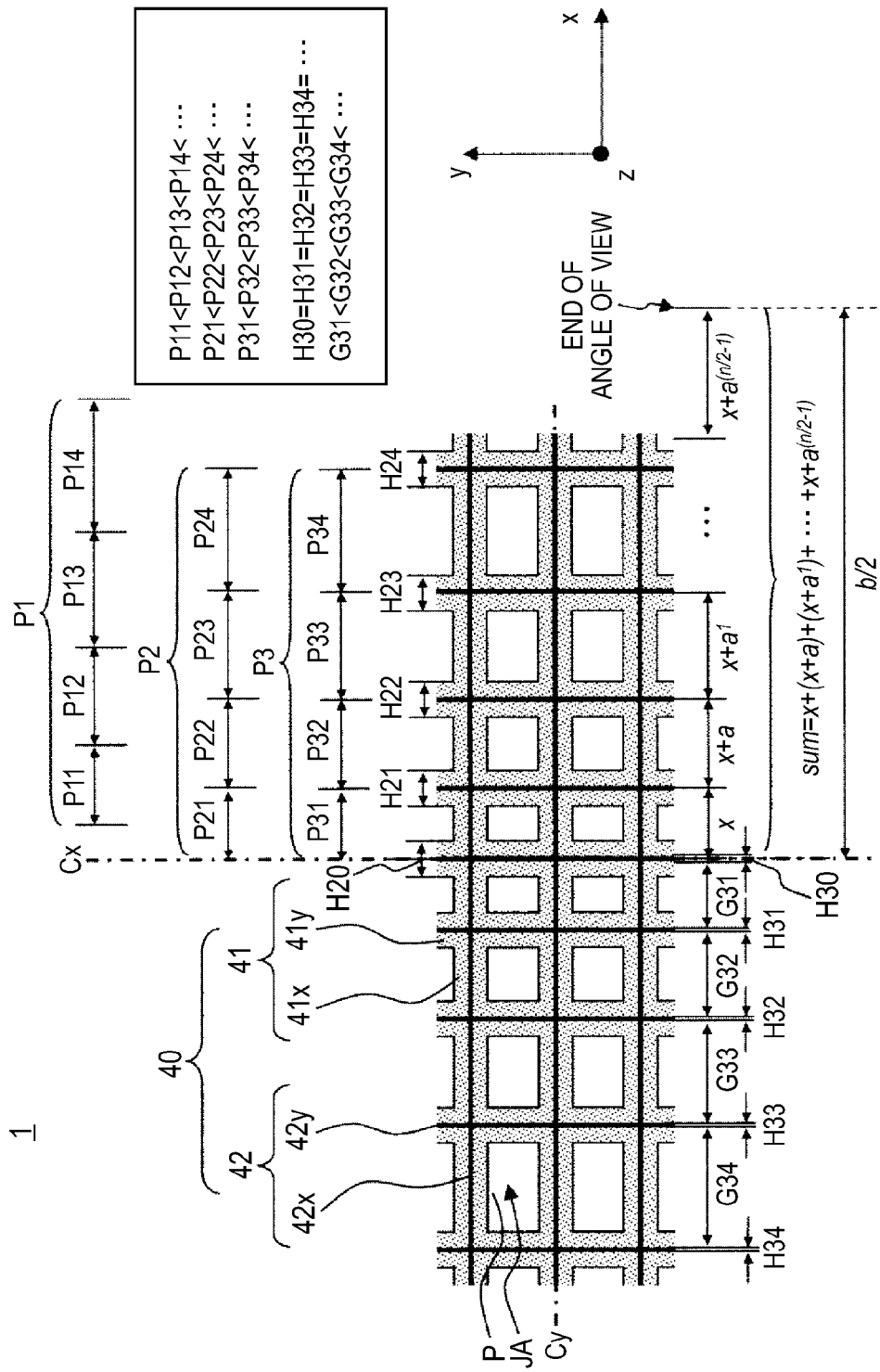
FIG. 5 shows another key portion of the solid-state imaging device in the first embodiment according to the invention.

FIGS. 3, 4, and 5 show key portions of the solid-state imaging device 1 in the first embodiment according to the invention.

FIGS. 3 and 4 are cross-sectional views, taken along the X direction, of key portions of the pixels arranged in the imaging region. FIG. 3 shows a central portion of the imaging region PA, and FIG. 4 shows a peripheral portion of the imaging region PA.

FIG. 5 is an enlarged top view showing a key portion of the imaging region PA of the solid-state imaging device 1. FIG. 5 shows a portion around the center Cy in the vertical direction y and the center Cx in the horizontal direction x in the imaging region PA, the portion includes a plurality of photoelectric converters P arranged in the horizontal direction x. Although not shown in FIG. 5, a portion including a plurality of photoelectric converters P arranged in the vertical direction y is configured in the same manner.

The solid-state imaging device 1 includes a substrate 101, as shown in FIGS. 3 and 4. The substrate 101 is, for example, an n-type silicon semiconductor substrate, and photodiodes 21, charge readout channel regions 22, charge transfer channel regions 23, and channel stopper regions 24 are provided in the substrate 101.

Transfer electrodes 31, light blocking portions 40, color filters 51, and on-chip lenses 61 are provided over the surface of the substrate 101, as shown in FIGS. 3 and 4.

The above components, which form the solid-state imaging device 1, will be described in order.

The photodiodes 21 are provided in the substrate 101 in correspondence with the photoelectric converters P, as shown in FIGS. 3 and 4. Each of the photodiodes 21 receives light incident on the light receiving surface JS and performs photoelectric conversion to produce a signal charge.

Specifically, the photodiodes 21 are provided in the substrate 101 but located close to the surface thereof. Although not shown, each of the photodiodes 21 includes, for example, a p-type semiconductor well region (p) (not shown) formed in the substrate 101, and an n-type semiconductor region (n) (not shown) and a p-type semiconductor region (p$^+$) (not shown) are subsequently formed on the p-type semiconductor well region (p). The n-type semiconductor region (n) functions as a signal charge accumulation region, and the p-type semiconductor region (p$^+$) functions as a hole accumulation region and suppresses dark current in the n-type semiconductor region (n), which is the signal charge accumulation region.

The color filters 51 and the on-chip lenses 61 are disposed above the respective photodiodes 21, as shown in FIGS. 3 and 4. The light receiving surface JS of each of the photodiodes 21 therefore receives light sequentially passing through the corresponding on-chip lens 61 and color filter 51.

The principal ray H1 is incident along the depth direction z, which is perpendicular to the light receiving surface JS, on the central portion of the imaging region PA (central portion of the angle of view), as shown in FIG. 3. The photodiodes 21 in the central portion receive the principal ray H1 incident along the depth direction z and produce signal charges.

On the other hand, the principal ray H2 is incident along a direction inclined to the depth direction z, which is perpendicular to the light receiving surface JS, on the peripheral portion of the imaging region PA (the end of the angle of view), as shown in FIG. 4. That is, the incident principal ray H2 is not perpendicular to the light receiving surface JS but inclined thereto. The photodiodes 21 in the peripheral portion receive the principal ray H2 incident along the inclined direction and produce signal charges.

In the present embodiment, a plurality of photoelectric converters P are arranged at first pitches P1 in the imaging plane (xy plane), as shown in FIG. 5. The plurality of photoelectric converters P are disposed at the first pitches P1, which increase with distance from the center Cx toward the periphery in the horizontal direction x in the imaging plane.

Specifically, the plurality of disposed photoelectric converters P satisfy the following equation (1) when the first pitches P1 are called P11, P12, P13, P14, ... counted from the center Cx toward the periphery in the horizontal direction x, as shown in FIG. 5.

$$P11 < P12 < P13 < P14 < \ldots \tag{1}$$

That is, the pitch P11 between the photoelectric converters P in the first and second pixels counted from the center Cx toward the periphery in the horizontal direction x of the imaging region PA is smaller than the pitch P12 between the photoelectric converters P in the second and third pixels. Further, the pitch P12 between the photoelectric converters P in the second and third pixels is smaller than the pitch P13 between the photoelectric converters P in the third and fourth pixels.

In addition to the above, the plurality of photoelectric converters P are formed in such a way that the area of the light receiving surfaces JS increases with distance from the center Cx toward the periphery in the horizontal direction x.

That is, the area of the light receiving surfaces JS of the photoelectric converter P in the first pixel counted from the center Cx toward the periphery in the horizontal direction x of the imaging region PA is smaller than the area of the light receiving surfaces JS of the photoelectric converter P in the second pixel. Further, the area of the light receiving surface JS of the photoelectric converter P in the second pixel is smaller than the area of the light receiving surface JS of the photoelectric converter P in the third pixel.

The photodiodes 21 formed in correspondence with the plurality of photoelectric converters P are therefore formed in such a way that the width of a photodiode 21 increases with distance from the center toward the periphery of the imaging region PA, as seen by comparing FIG. 3 with FIG. 4.

The first pitch P1 described above is the distance between the centers of the plurality of photoelectric converters P arranged in the horizontal direction x. The plurality of photoelectric converters P arranged in the vertical direction y are formed in the same manner as the plurality of photoelectric converters P arranged in the horizontal direction x.

The charge readout channel regions 22 are provided in correspondence with the charge readout portions R0 and configured to read signal charges produced in the photodiodes 21, as shown in FIGS. 3 and 4.

Specifically, the charge readout channel regions 22 are provided in the substrate 101 but located close to the surface thereof and adjacent to the respective photodiodes 21, as shown in FIGS. 3 and 4.

In the present embodiment, the charge readout channel regions 22 are disposed on the left of the respective photodiodes 21 in the horizontal direction x. For example, each of the charge readout channel regions 22 is formed as a p-type semiconductor region.

The charge transfer channel regions 23 are provided in correspondence with the vertical transfer registers VT, as shown in FIGS. 3 and 4, and configured to transfer the signal charges read from the respective photodiodes 21 through the respective charge readout portions R0.

Specifically, the charge transfer channel regions 23 are provided in the substrate 101 but located close to the surface thereof and adjacent to the respective charge readout channel regions 22, as shown in FIGS. 3 and 4.

In the present embodiment, the charge transfer channel regions 23 are disposed on the left of the respective charge readout channel regions 22 in the horizontal direction x. For example, each of the charge transfer channel regions 23 is formed by providing an n-type semiconductor region (n) (not shown) on a p-type semiconductor well region (p) (not shown) in the substrate 101.

The channel stopper regions 24 are provided in correspondence with the element isolators SS, as shown in FIGS. 3 and 4.

Specifically, the channel stopper regions 24 are provided in the substrate 101 but located close to the surface thereof, as shown in FIGS. 3 and 4.

In the present embodiment, each of the channel stopper regions 24 is provided, in the horizontal direction x, on the left of the corresponding charge readout channel region 23 and between the charge readout channel region 22 and the photodiode 21 disposed in the adjacent column, as shown in FIGS. 3 and 4.

In the vertical direction y, since the element isolators SS are provided to separate the plurality of photoelectric converters P as shown in FIG. 2, the channel stopper regions 24 described above are provided between any pair of two photodiodes 21 arranged in the vertical direction y, but no cross section of this portion is shown.

Each of the channel stopper regions 24 described above is, for example, formed by providing a p-type semiconductor region (p+) (not shown) on a p-type semiconductor well region (p) (not shown) in the substrate 101, and forms a potential barrier to prevent any signal charge from flowing in and out.

The transfer electrodes 31 are provided above the substrate 101 in correspondence with the vertical transfer registers VT, as shown in FIGS. 3 and 4, and configured to function as vertical transfer electrodes that transfer the read signal charges in the vertical direction y. The transfer electrodes 31 are also disposed in correspondence with the charge readout portions R0 and configured to function as charge readout electrodes that read signal charges produced by the photodiodes 21.

Specifically, each of the transfer electrodes 31 is disposed on the upper surface of the substrate 101 and faces the corresponding charge readout channel region 22 and charge transfer channel region 23 via a gate insulating film Gx, as shown in FIGS. 3 and 4.

For example, each of the transfer electrodes 31 is made of polysilicon or any other suitable conductor and provided on the gate insulating film Gx formed of, for example, a silicon oxide film.

The transfer electrodes 31 are provided between the plurality of photoelectric converters P, as shown in FIGS. 3 and 4. Although not shown, each of the plurality of transfer electrodes 31 includes a portion extending in the horizontal direction x on the upper surface of the substrate 101, and the plurality of extending portions are electrically connected in the horizontal direction x.

In addition to the transfer electrodes 31 shown in FIGS. 3 and 4, other transfer electrodes (not shown) are provided between the plurality of photoelectric converters P arranged in the vertical direction y. The two types of transfer electrode are alternately provided in the vertical direction.

The light blocking portions 40 are provided above the substrate 101, as shown in FIGS. 3 and 4.

Each of the light blocking portions 40 includes an electrode light blocking layer 41 and a pixel isolation and light blocking layer 42, as shown in FIGS. 3 and 4.

In each of the light blocking portions 40, the electrode light blocking layer 41 is formed on the surface of the substrate 101 and above the corresponding charge readout channel region 22 and charge transfer channel region 23, as shown in FIGS. 3 and 4. The electrode light blocking layer is provided also to cover the corresponding transfer electrode 31 via an insulating film Sz. The insulating film Sz is, for example, a PSG film, and the electrode light blocking layer 41 is made of a light-blocking metallic material that blocks light, such as tungsten and aluminum.

In each of the light blocking portions 40, the pixel isolation and light blocking layer 42 protrudes from the upper surface of the electrode light blocking layer 41, as shown in FIGS. 3 and 4. For example, the pixel isolation and light blocking layer 42 is made of a metallic material, such as tungsten and aluminum, like the electrode light blocking layer 41.

In the present embodiment, the light blocking portions are provided between the plurality of photoelectric converters P arranged in the imaging region PA, as shown in FIG. 5. In FIG. 5, the light blocking portions 40 are disposed between the plurality of photoelectric converters P arranged in the horizontal direction x and between the photoelectric converters P arranged in the vertical direction y. That is, the plurality of light blocking portions 40 are interposed between the photoelectric converters P in the horizontal direction x. Further, the plurality of light blocking portions 40 are interposed between the photoelectric converters P in the vertical direction y.

In each of the plurality of light blocking portions 40, the electrode light blocking layer 41 includes portions 41$x$ extending in the horizontal direction x and portions 41$y$ extending in the vertical direction y (both the portions 41$x$ and 41$y$ are electrode light blocking portions), and the portions 41$x$ and 41$y$ are integrated with each other, as shown in FIG. 5.

A plurality of portions 41$y$, each of which extends in the vertical direction y in the corresponding electrode light blocking layer 41, are arranged at second pitches P2 in the horizontal direction x of the imaging region PA, as shown in FIG. 5. The portions 41$y$ are formed in such a way that the second pitch P2 increases with distance from the center Cx toward the periphery in the horizontal direction x in the imaging region PA.

Specifically, the disposed portions 41$y$ satisfy the following equation (2) when the second pitches P2 are called P21, P22, P23, P24, . . . counted from the center Cx toward the periphery in the horizontal direction x, as shown in FIG. 5.

$$P21 < P22 < P23 < P24 < \ldots \quad (2)$$

In the present embodiment, the second pitches P2 and the first pitches P1, at which the plurality of photoelectric converters P are arranged, increase at the same rate, as shown in FIG. 5.

The portions 41y extending in the vertical direction y in the respective electrode light blocking layers 41 are formed in such a way that the widths H20, H21, H22, H23, H24, . . . defined in the horizontal direction x have the same value, as shown in FIG. 5.

The second pitches P2 described above show the distances between the centers of the widths H20, H21, H22, H23, H24, . . . defined in the horizontal direction x based on the portions 41y extending in the vertical direction y in the respective electrode light blocking layers 41. The portions 41x extending in the horizontal direction x in the respective electrode light blocking layers 41 are provided in the same manner as the portions 41y extending in the vertical direction y in the respective electrode light blocking layers 41.

On the other hand, in each of the plurality of light blocking portions 40, the pixel isolation and light blocking layer 42 includes portions 42x extending in the horizontal direction x and portions 42y extending in the vertical direction y (both the portions 42x and 42y are pixel isolation and light blocking portions), and the portions 42x and 42y are integrated with each other, as shown in FIG. 5.

A plurality of portions 42y, each of which extends in the vertical direction y in the corresponding pixel isolation and light blocking layer 42, are arranged at third pitches P3 in the horizontal direction x of the imaging region PA, as shown in FIG. 5. The portions 42y are formed in such a way that the third pitch P3 increases with distance from the center Cx toward the periphery in the horizontal direction x in the imaging region PA.

Specifically, the disposed portions 42y satisfy the following equation (3) when the third pitches P3 are called P31, P32, P33, P34, . . . counted from the center Cx toward the periphery in the horizontal direction x, as shown in FIG. 5.

$$P31 < P32 < P33 < P34 < \ldots \quad (3)$$

In the present embodiment, the third pitches P3 and the second pitches P2, at which the portions extending in the vertical direction y are disposed in the pixel isolation and light blocking layer 42, increase at the same rate, as shown in FIG. 5. That is, the first pitch P1, the second pitch P2, and the third pitch P3 described above increase at the same rate across the area from the center Cx to the periphery of the imaging region.

The portions 42y extending in the vertical direction y in the respective pixel isolation and light blocking layers 42 are formed in such a way that the widths H30, H31, H32, H33, H34, . . . defined in the horizontal direction x have the same value, as shown in FIG. 5.

As a result, in the present embodiment, the widths G31, G32, G33, G34, . . . of the spaces between the portions 42y extending in the vertical direction y in the respective pixel isolation and light blocking layers 42 satisfy the following equation (4). That is, the portions 42y widen with distance from the center Cx toward the periphery in the horizontal direction x in the imaging region PA.

$$G31 < G32 < G33 < G34 < \ldots \quad (4)$$

The third pitches P3 described above show the distances between the centers of the widths H30, H31, H32, H33, H34, . . . defined in the horizontal direction x based on the portions 42y extending in the vertical direction y in the respective pixel isolation and light blocking layers 42. The portions 42x extending in the horizontal direction x in the respective pixel isolation and light blocking layers 42 are also provided in the same manner. That is, the pixel isolation and light blocking layers 42 are arranged in a grid-like matrix formed of partitioned unit cells, and the area of the partitioned regions increases from the center toward the periphery of the imaging region PA.

More specifically, the light blocking portions are formed in such a way that they satisfy the relationship shown in a lower part of FIG. 5. The light blocking portions are formed by setting the value of a factor "a" to satisfy the equation (5) below. It is noted that the factor "a" is set to satisfy a>1.

$$\frac{b}{2} = x + (x + a^1) + (x + a^2) + \ldots + (x + a^{(\frac{n}{2}-1)}) \quad (5)$$

The variables in the above equation mean as follows:

n: the number of effective pixels in the horizontal direction (vertical direction)

x: the size of the pixel at the center of the angle of view (reference width) (nm)

a: the amount of shift (nm) (a>1)

b: the horizontal (vertical) dimension of the effective pixel region (nm)

In FIG. 5, the term "sum" represents the total distance (nm) from the center of the angle of view to the end thereof.

That is, the electrode light blocking layers 41 and pixel isolation and light blocking layers 42 are formed in such a way that whenever the pixel position shifts toward the periphery, the amount of shift $[a^{(n/2-1)}]$ is added to the distance (x) between the center Cx in the horizontal direction x of the imaging region PA and the portion adjacent to the center.

The color filters 51 are provided above the substrate 101, as shown in FIGS. 3 and 4.

Specifically, each of the color filters 51 is formed above the corresponding photodiode 21 and electrode light blocking layer 41 via passivation films Es.

In the present embodiment, the color filters 51 are formed between the pixel isolation and light blocking layers 42, as shown in FIGS. 3 and 4. That is, the color filters 51 are buried in the portions partitioned by the pixel isolation and light blocking layers 42.

Each of the color filters 51 colors the incident light and outputs it toward the corresponding light receiving surface JS. For example, each of the color filters 51 is made of a photosensitive resin containing a coloring agent. Although not shown, the color filters 51 are formed of three primary color filters, green filters, red filters, and blue filters. The three primary color filters are disposed in the imaging region PA shown in FIG. 2 in correspondence with the photoelectric converters P, for example, in the Bayer layout.

The on-chip lenses 61 are provided above the substrate 101 and on the color filters 51, as shown in FIGS. 3 and 4.

In the present embodiment, each of the on-chip lenses 61 is a convex lens whose central portion is thicker than the periphery in the direction from the light receiving surface JS of the corresponding photodiode 21 toward the corresponding color filter 51, and focuses the incident light on the light receiving surface JS. For example, each of the on-chip lenses 61 has a circular shape in a plan view. The light focused by the on-chip lens 61 therefore passes through the color filter 51 and is received by the light receiving surface JS of the corresponding photodiode 21.

As described above, in the present embodiment, the photodiodes 21 are formed in such a way that those in the central portion of the imaging region PA are wider than those in the peripheral portion thereof, as seen by comparing FIG. 3 with FIG. 4. Similarly, the on-chip lenses 61 are formed in such a way that the width and hence the area thereof increase with distance from the center toward the periphery of the imaging region PA.

[Manufacturing Method]

A method for manufacturing the above solid-state imaging device 1 will be described below.

FIGS. 6, 7, 8, and 9 show a key portion formed in the steps of the method for manufacturing the solid-state imaging device 1 in the first embodiment according to the invention. FIGS. 6, 7, 8, and 9 show the same cross section as that shown in FIG. 3.

In the following description, the step of forming the pixel isolation and light blocking layers 42 will primarily be described.

(1) Formation of Planarization Film FT

Figure 6:
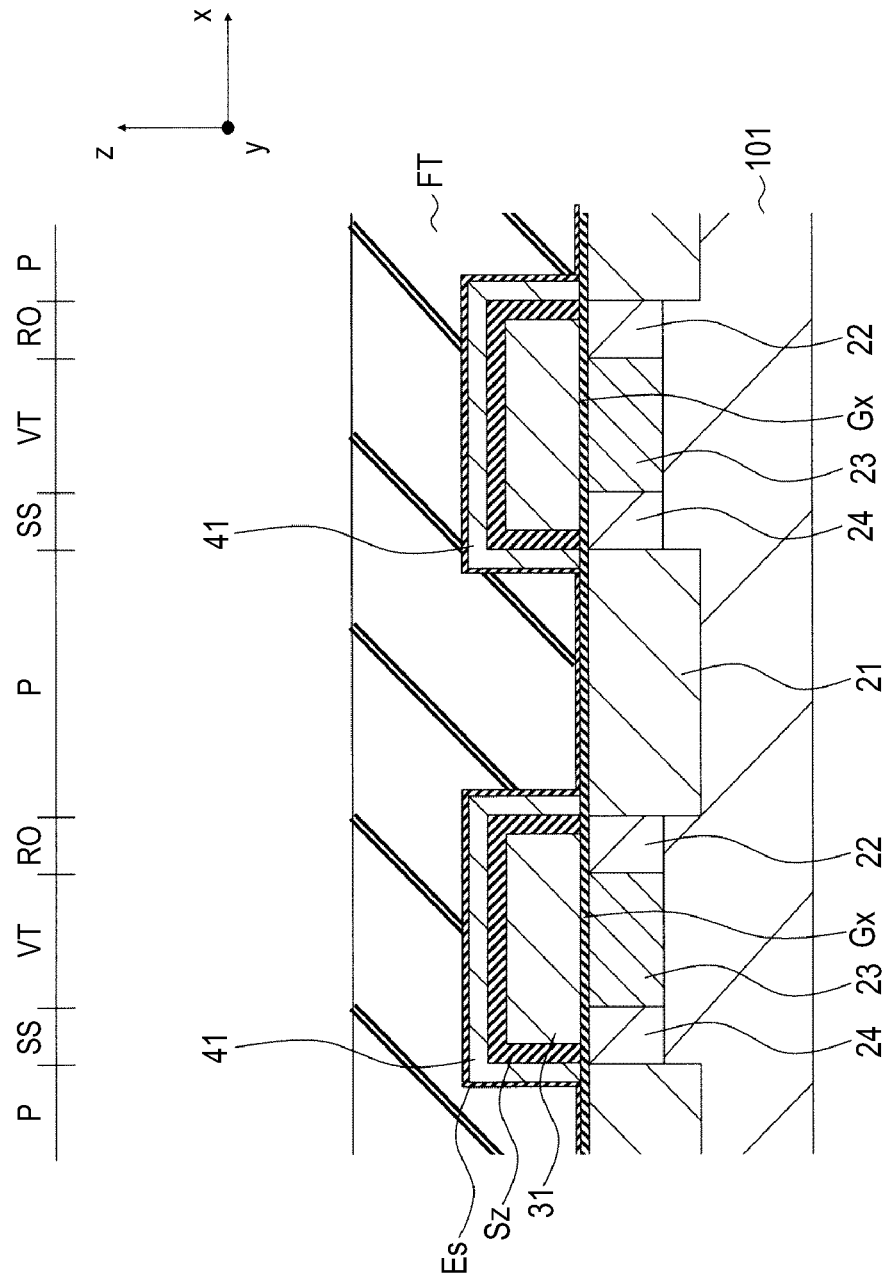
FIG. 6 shows a key portion formed in a step of a method for manufacturing the solid-state imaging device in the first embodiment according to the invention.

A planarization film FT is first formed, as shown in FIG. 6.

Before the formation of the planarization film FT, the photodiodes 21, the charge readout channel regions 22, the charge transfer channel regions 23, and the channel stopper regions 24 are provided in the substrate 101, as shown in FIG. 6. For example, ion implantation is used to introduce impurities into the substrate 101 to form the components described above. Thereafter, thermal oxidation is, for example, used to form a silicon oxide film over the substrate 101. The gate insulating film Gx is thus formed.

The transfer electrodes 31 and other components are formed on the surface of the substrate 101, as shown in FIG. 6. For example, CVD is used to form a polysilicon film (not shown), and then photolithography is used to pattern the polysilicon film. The transfer electrodes 31 are thus formed. The insulating film Sz, for example, a PSG film, is formed to cover the transfer electrodes 31. Thereafter, sputtering is, for example, used to form a tungsten film, and then photolithography is used to pattern the tungsten film. The electrode light blocking layers 41 are thus formed. The passivation film Es is then formed to cover the photodiodes 21 and the transfer electrodes 31. The passivation film Es functions as an etching stopper when an etchant is used to remove the planarization film FT in a later process. For example, the passivation film Es is formed of a P-SiN film.

Thereafter, the planarization film FT is formed to cover the passivation film Es, as shown in FIG. 6.

In the present embodiment, SOG or any other suitable resin is applied to form a film, and then CMP or any other suitable planarization process is carried out to form the planarization film FT. The planarization film FT may alternatively be formed of a TEOS-based $SiO_2$/BPSG film or an $SiO_2$-based CVD film formed by using biased high-density plasma.

(2) Formation of Grooves K1

Figure 7:
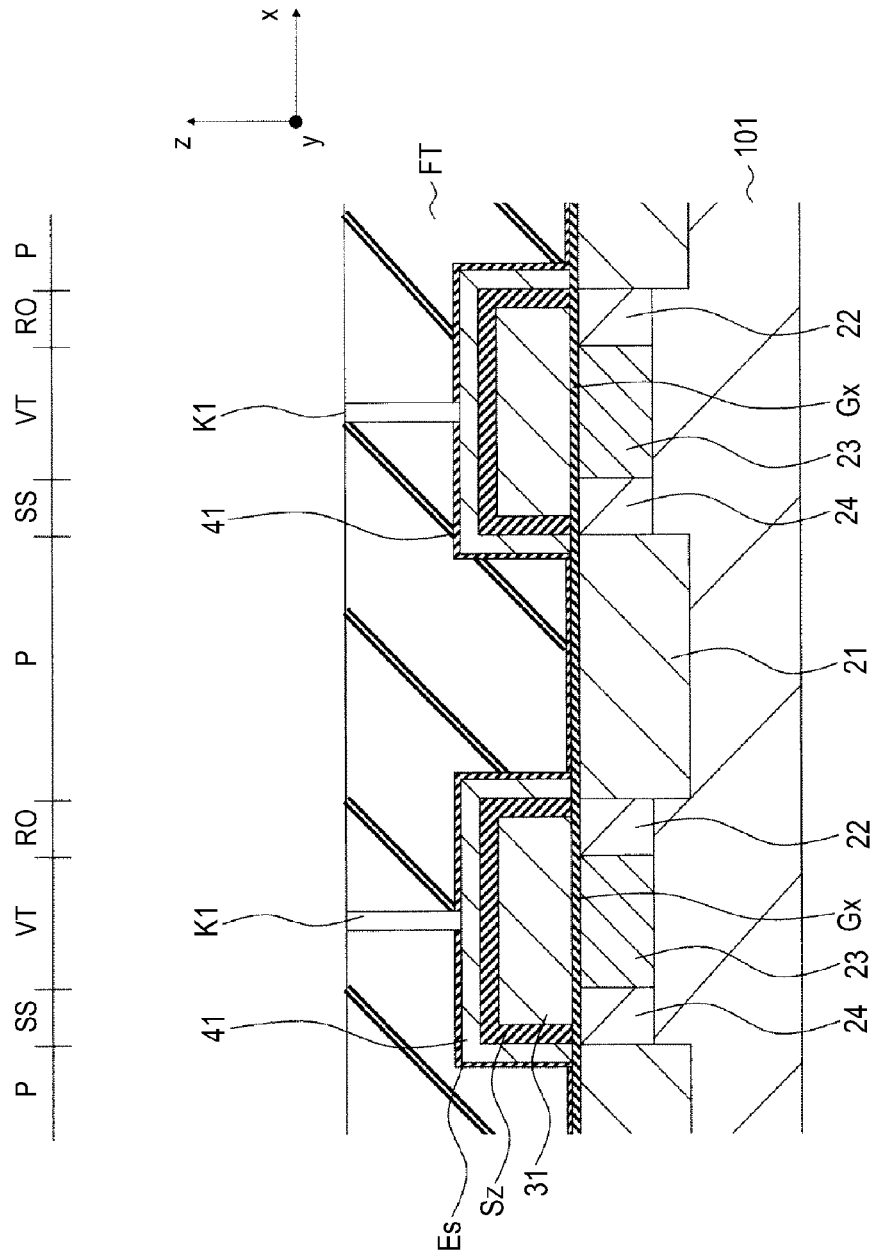
FIG. 7 shows the key portion formed in another step of the method for manufacturing the solid-state imaging device in the first embodiment according to the invention.

Grooves K1 are then formed, as shown in FIG. 7. In the present embodiment, the grooves K1 are formed in the portions of the planarization film FT where the pixel isolation and light blocking layers 42 described above are formed (see FIG. 3, for example), as shown in FIG. 7.

Specifically, photolithography and dry etching are used to form the grooves K1, each of which having a width of 1 μm or smaller, so that part of the upper surfaces of the electrode light blocking layers 41 is exposed.

(3) Formation of Pixel Isolation and Light Blocking Layers 42

Figure 8:
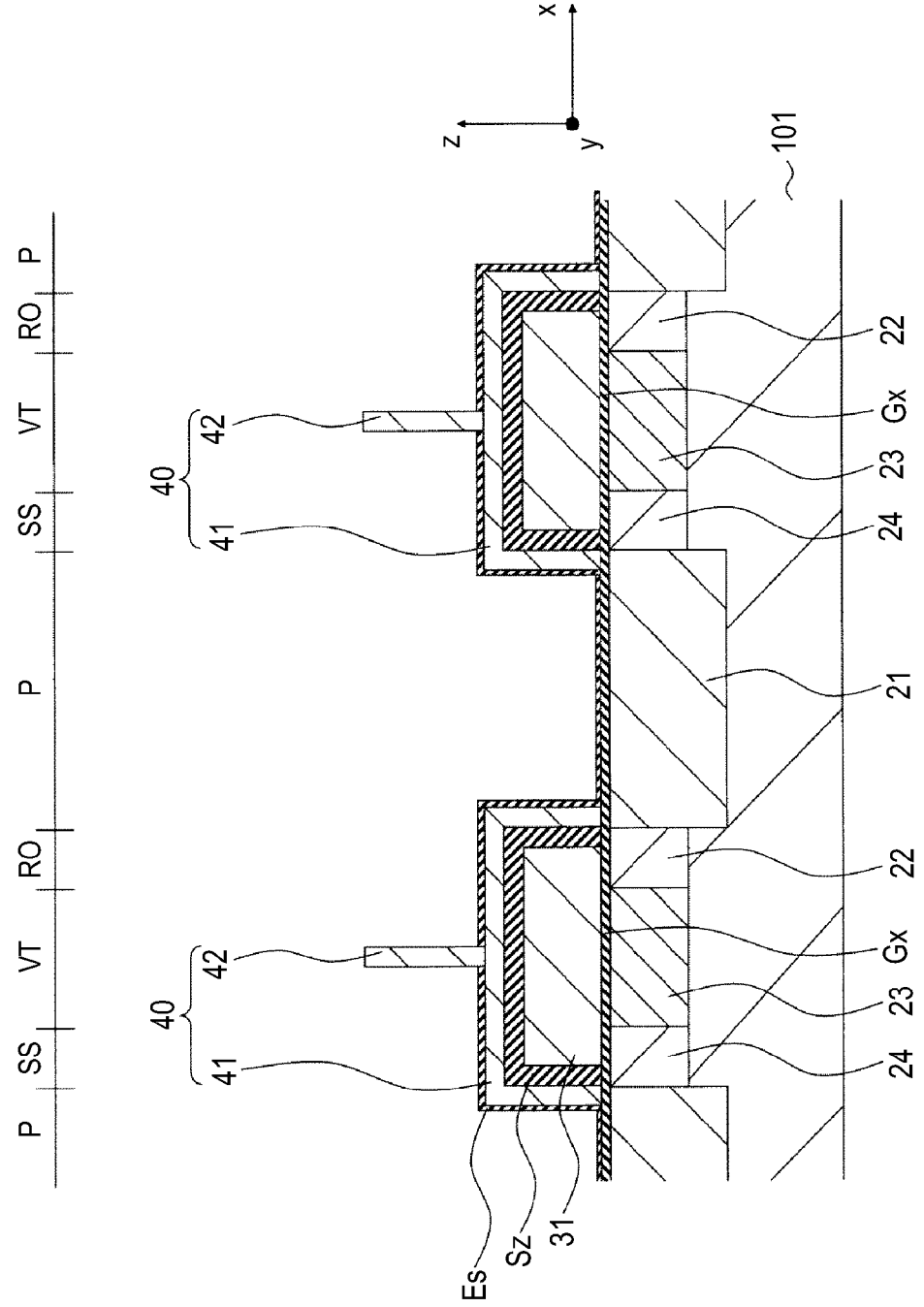
FIG. 8 shows the key portion formed in another step of the method for manufacturing the solid-state imaging device in the first embodiment according to the invention.

The pixel isolation and light blocking layers 42 are then formed, as shown in FIG. 8.

In the present embodiment, the grooves K1 formed as described above are filled with a light-blocking material, and then the planarization film FT is removed to form the pixel isolation and light blocking layers 42, as shown in FIG. 8.

For example, CVD or sputtering is used to form a film by filling the grooves K1 with a metallic material, and then the resultant structure is etched back to remove the metal film (not shown) on the planarization film FT. Thereafter, for example, HF-based etching is carried out to remove the planarization film FT.

(4) Formation of Color Filters 51

Figure 9:
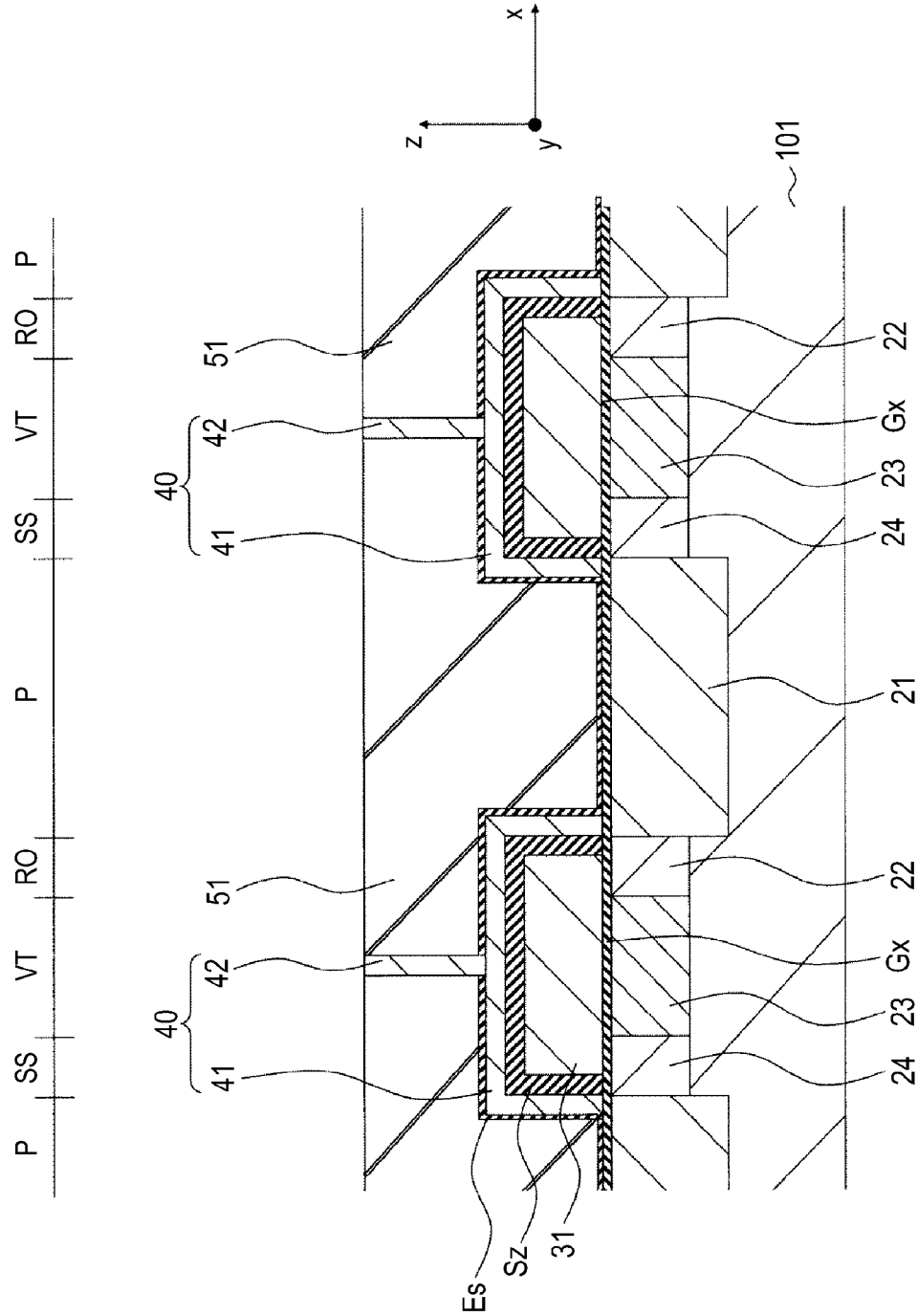
FIG. 9 shows the key portion formed in another step of the method for manufacturing the solid-state imaging device in the first embodiment according to the invention.

The color filters 51 are then formed, as shown in FIG. 9.

In the present embodiment, the color filters 51 are formed by filling the spaces between the pixel isolation and light blocking layers 42, as shown in FIG. 9.

Specifically, the color filters 51 are formed by applying a photosensitive resin material containing a coloring agent.

The other portions are then provided. The solid-state imaging device 1 is thus completed.

[Brief]

As described above, in the present embodiment, the photodiodes 21 are formed in such a way that the first pitch P1 increases and the area of the light receiving surfaces JS increases with distance from the center toward the periphery of the imaging region PA. The electrode light blocking layers 41 are formed to include portions in which the second pitch P2 increases with distance from the center toward the periphery of the imaging region PA. Further, the pixel isolation and light blocking layers 42 are formed to include portions in which the third pitch P3 increases with distance from the center toward the periphery of the imaging region PA. In the present embodiment, the first pitch P1, the second pitch P2, and the third pitch P3 increase at the same rate over the area from the center to the periphery of the imaging region PA. That is, the pixel isolation and light blocking layers 42 are formed to include portions in which the widths G31, G32, G33, G34, . . . of the spaces between the pixel isolation and light blocking layers 42 increase with distance from the center toward the periphery of the imaging region PA.

As described above, at the end of the angle of view (the periphery of the imaging region PA), since the principal ray H2 is incident at a large angle, the light receiving surface JS of each of the photodiodes 21 in that region does not readily receive the incident light, a captured image suffers from shading in some cases. When the inclined incident principal ray H2 enters the photodiode 21 in the adjacent pixel, color mixing occurs in a captured image in some cases (see FIG. 4).

In the present embodiment, however, the area of the light receiving surface JS at the end of the angle of view (the periphery of the imaging region PA) is larger than that at the center of the angle of view (the center of the imaging region PA). Further, the distance between the plurality of light blocking portions 40 is larger at the periphery of the imaging region PA than at the center of thereof. Moreover, the on-chip lenses 61 are formed in such a way that the area thereof increases with distance from the center toward the periphery of the imaging region PA. It is therefore possible to improve the sensitivity at the end of the angle of view without compromising the sensitivity at the center of the angle of view, and also possible to suppress shading in a captured image. Further, since the inclined principal ray directed toward the photodiode 21 in the pixel adjacent to a pixel in question is blocked by the corresponding pixel isolation and light blocking layer 42, color mixing can be suppressed in a captured image.

In the present embodiment, the image quality of a captured image can thus be improved.

The present embodiment has been presented with reference to the case where the first to third pitches P1, P2, and P3 and the area of the light receiving surfaces JS increase with distance from the center toward the periphery of the imaging region PA in both the horizontal direction x and the vertical direction y, but the present embodiment is not limited thereto. The present embodiment may be configured in such a way that the first to third pitches P1, P2, and P3 and the area of the light receiving surfaces JS increase only in the horizontal direction x or the vertical direction y.

2. Second Embodiment

Device Configuration and Others

Figure 10:
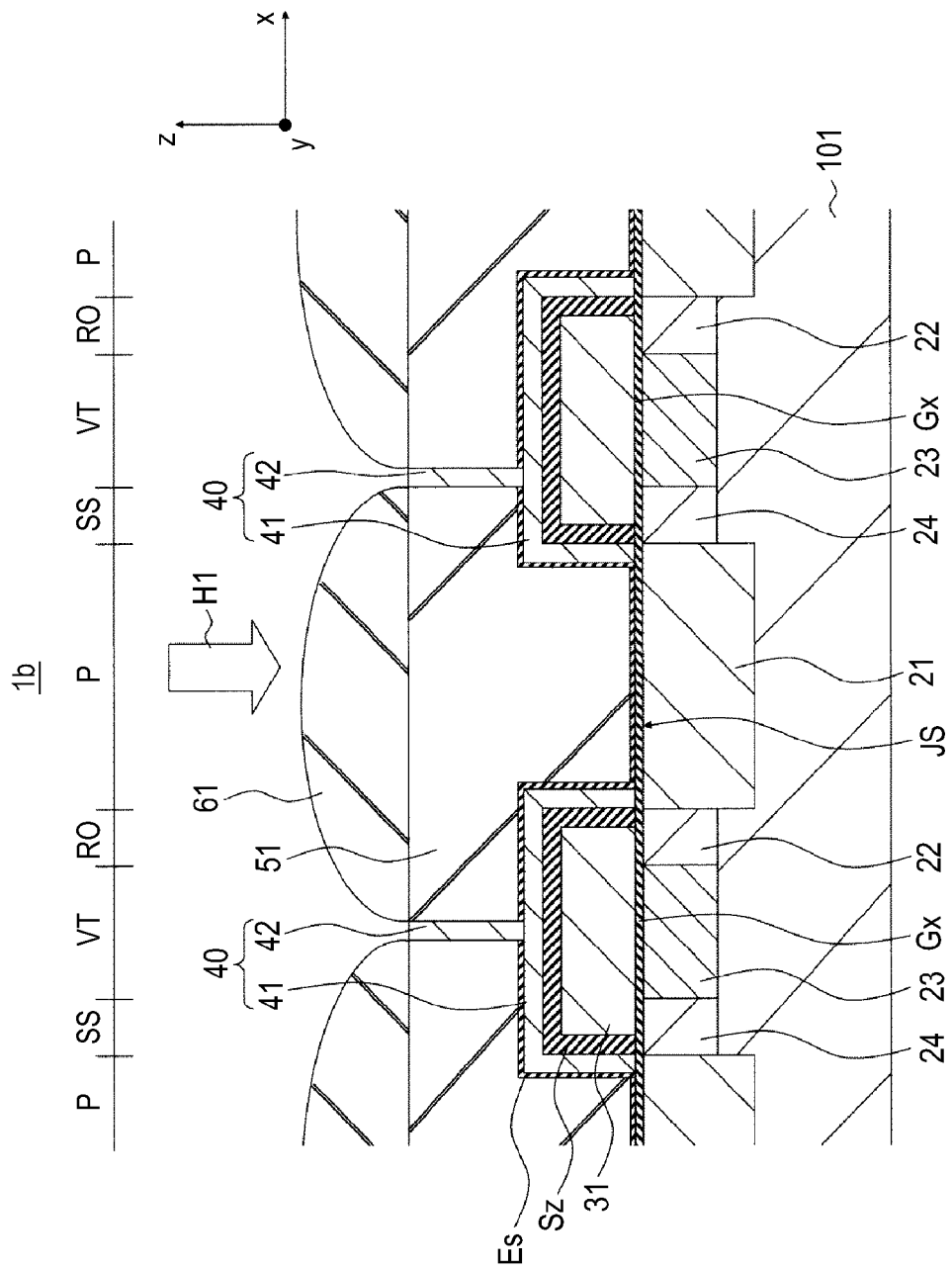
FIG. 10 shows a key portion of a solid-state imaging device in a second embodiment according to the invention.
Figure 11:
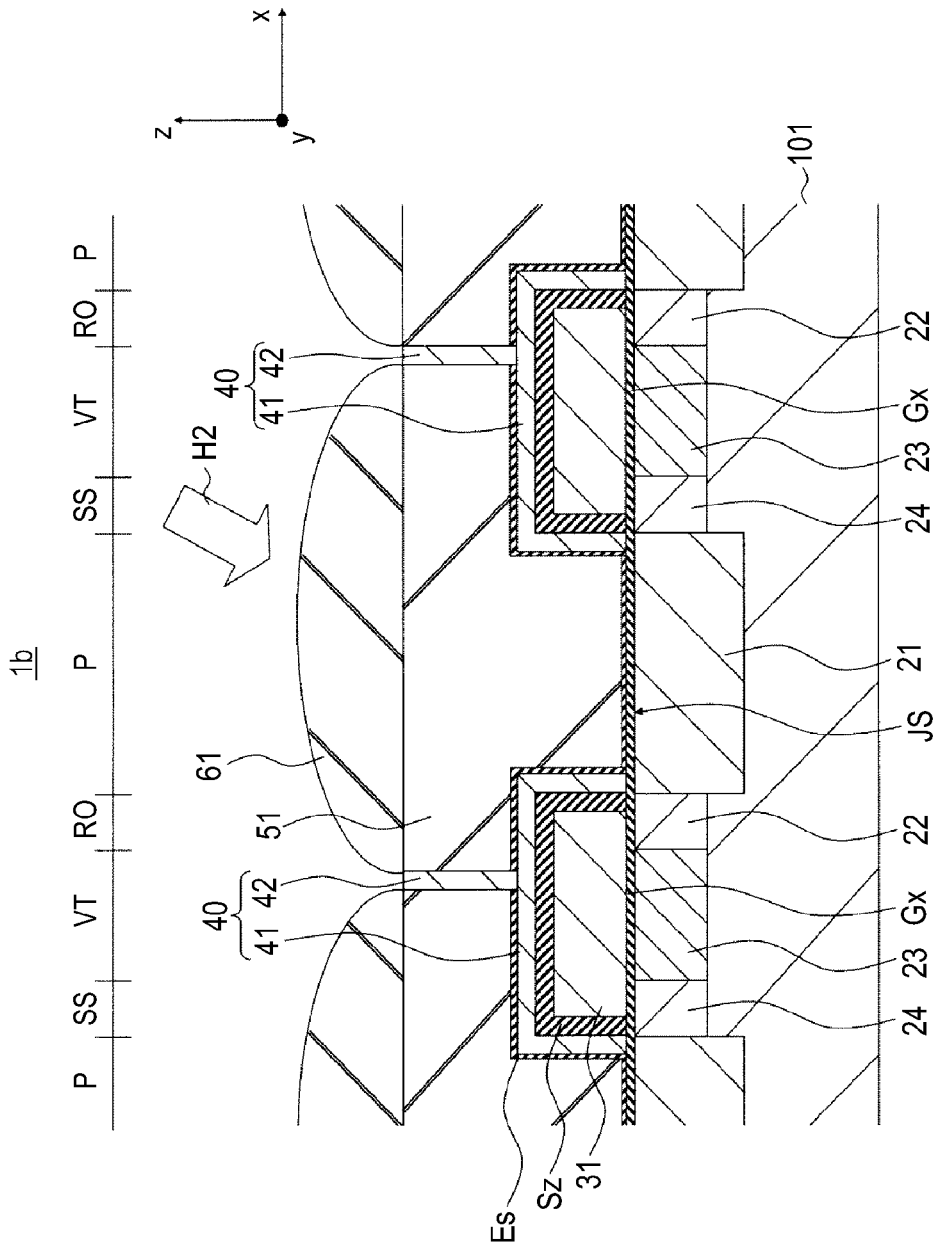
FIG. 11 shows another key portion of the solid-state imaging device in the second embodiment according to the invention.
Figure 12:
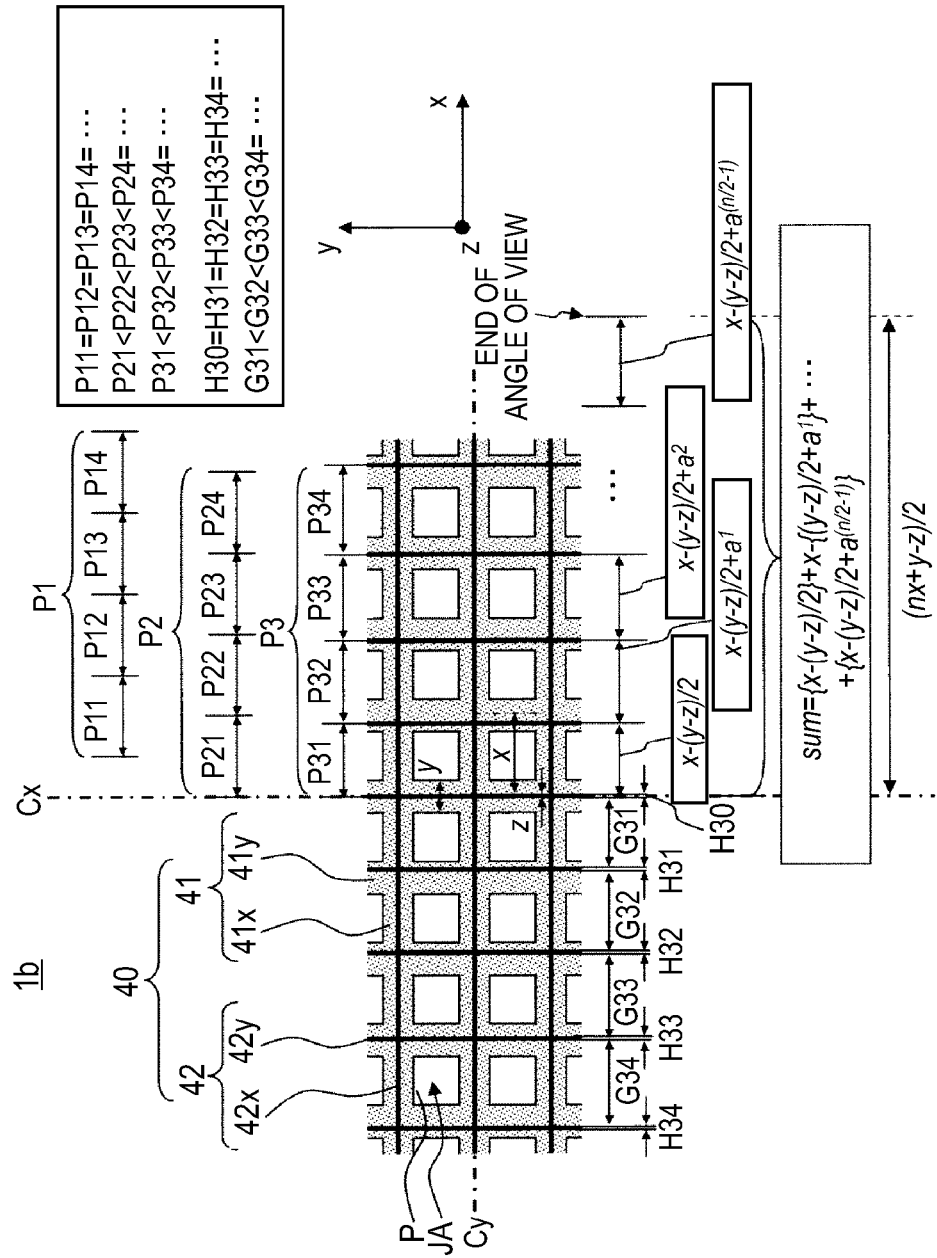
FIG. 12 shows another key portion of the solid-state imaging device in the second embodiment according to the invention.

FIGS. 10, 11, and 12 show key portions of a solid-state imaging device 1b in a second embodiment according to the invention.

FIGS. 10 and 11 are cross-sectional views, taken along the X direction, of key portions of the pixels arranged in the imaging region PA shown in FIG. 2. FIG. 10 shows a central portion of the imaging region PA, and FIG. 11 shows a peripheral portion of the imaging region PA.

FIG. 12 is an enlarged top view showing a key portion of the imaging region PA of the solid-state imaging device 1b. FIG. 12 shows a portion around the center Cy in the vertical direction y and the center Cx in the horizontal direction x in the imaging area PA, and the portion includes a plurality of photoelectric converters P arranged in the horizontal direction x. Although not shown in FIG. 12, a portion including a plurality of photoelectric converters P arranged in the vertical direction y is configured in the same manner.

As shown in FIGS. 10, 11, and 12, the solid-state imaging device 1b in the present embodiment differs from the solid-state imaging device 1 in the first embodiment in terms of the arrangement of the photoelectric converters P, the electrode light blocking layers 41, and the pixel isolation and light blocking layers 42. The present embodiment is the same as the first embodiment except the point described above and points associated therewith. No description of the redundant portions will be made.

The photoelectric converters P are arranged at first pitches P1 in a plurality of imaging planes (xy plane), as shown in FIG. 12. The plurality of photoelectric converters P are disposed at the first pitches P1, which have the same value over the imaging region PA from the center Cx to the periphery thereof.

Specifically, the plurality of disposed photoelectric converters P satisfy the following equation (1b) when the first pitches P1 are called P11, P12, P13, P14, ... counted from the center Cx toward the periphery in the horizontal direction x, as shown in FIG. 12.

$$P11=P12=P13=P14=\ldots \quad (1b)$$

In addition to the above, the plurality of photoelectric converters P are formed in such a way that the areas of the light receiving surfaces JS are the same over the region from the center Cx toward the periphery in the horizontal direction x.

The photodiodes 21 formed in correspondence with the plurality of photoelectric converters P are therefore formed in such a way that the widths of the photodiodes 21 in the central portion of the imaging region PA are the same as those of the photodiodes 21 in the peripheral portion, as shown FIGS. 10 and 11.

The plurality of photoelectric converters P arranged in the vertical direction y are formed in the same manner described above. That is, the plurality of photoelectric converters P arranged in the vertical direction y are formed in such a way that the areas of the light receiving surfaces JS are the same over the region from the center Cy toward the periphery, like the plurality of photoelectric converters P arranged in the horizontal direction x.

In each of the light blocking portions 40, the electrode light blocking layer 41 includes portions 41x extending in the horizontal direction x and portions 41y extending in the vertical direction y, as shown in FIG. 12. A plurality of portions 41y, each of which extends in the vertical direction y in the corresponding electrode light blocking layer 41, are arranged at second pitches P2 in the horizontal direction x of the imaging region PA, as shown in FIG. 12.

The portions 41y are disposed in such away that the second pitches P2 have the same value over the imaging region PA from the center Cx toward the periphery thereof.

Specifically, the disposed portions 41y satisfy the following equation (2b) when the second pitches P2 are called P21, P22, P23, P24, ... counted from the center Cx toward the periphery in the horizontal direction x, as shown in FIG. 12.

$$P21=P22=P23=P24=\ldots \quad (2b)$$

In the present embodiment, the second pitches P2 are equal to the first pitches P1, at which the plurality of photoelectric converters P are disposed, and have a fixed value, as shown in FIG. 12.

The electrode light blocking layers 41 are therefore formed in such a way that the distances therebetween in the central portion of the imaging region PA are the same as those in the peripheral portion, as shown in the cross-sectional views of FIGS. 10 and 11.

The portions 41x extending in the horizontal direction x in the respective electrode light blocking layers 41 are provided in the same manner as the portions 41y extending in the vertical direction y in the respective electrode light blocking layers 41.

Further, in each of the plurality of light blocking portions 40, the pixel isolation and light blocking layer 42 includes portion 42x extending in the horizontal direction x and portions 42y extending in the vertical direction y, as shown in FIG. 12. A plurality of portions 42y, each of which extends in the vertical direction y in the corresponding pixel isolation and light blocking layer 42, are arranged at third pitches P3 in the horizontal direction x of the imaging region PA, as shown in FIG. 12.

As shown in FIG. 12, the portions 42y are formed in such a way that the third pitch P3 increases with distance from the center Cx toward the periphery in the horizontal direction x in the imaging region PA, as in the first embodiment.

Specifically, the disposed portions 42y satisfy the following equation (3b) when the third pitches P3 are called P31, P32, P33, P34, ... counted from the center Cx toward the periphery in the horizontal direction x, as shown in FIG. 12.

$$P31<P32<P33<P34<\ldots \quad (3b)$$

As a result, in the present embodiment, the widths G31, G32, G33, G34, ... of the spaces between the portions 42y extending in the vertical direction y in the respective pixel isolation and light blocking layers 42 satisfy the following equation (4b). That is, the portions 42y widen with distance from the center Cx toward the periphery in the horizontal direction x in the imaging region PA.

$$G31<G32<G33<G34<\ldots \quad (4b)$$

The pixel isolation and light blocking layers 42 are therefore formed in such a way that the distances therebetween increase with distance from the center toward the periphery of the imaging region PA, as shown in the cross-sectional views of FIGS. 10 and 11.

More specifically, the third pitches P3 (P31, P32, P33, P34, . . . ) are defined as shown in a lower right part of FIG. 12. The pixel isolation and light blocking layers 42 are formed in such a way that a factor "a" satisfies the equation (5b) below. It is noted that the factor "a" is set to satisfy a>1.

$$\left(x-\frac{y-z}{2}\right)+\left(x-\frac{y-z}{2}+a^1\right)+ \\ \left(x-\frac{y-z}{2}+a^2\right)+\ldots+\left(x-\frac{y-z}{2}+a^{\left(\frac{n}{2}-1\right)}\right) \le \frac{nx+y-z}{2} \quad (5b)$$

The variables in the above equation mean as follows:
n: the number of effective pixels in the horizontal direction (vertical direction)
x: the size of a pixel (reference width) (nm)
y: the width of an electrode light blocking layer (nm)
a: the amount of shift (nm) (a>1)
z: the width of a pixel isolation and light blocking layer (nm)

In FIG. 12, the term "sum" represents the total distance (nm) from the center of the angle of view to the end thereof.

The portions 42x extending in the horizontal direction x in the respective pixel isolation and light blocking layers 42 are provided in the same manner.

[Brief]

As described above, in the present embodiment, the pixel isolation and light blocking layers 42 are formed to include portions in which the third pitch P3 increases with distance from the center toward the periphery of the imaging region PA. That is, the pixel isolation and light blocking layers 42 are formed to include portions in which the widths G31, G32, G33, G34, . . . of the spaces between the pixel isolation and light blocking layers 42 increase with distance from the center toward the periphery of the imaging region PA.

It is therefore possible in the present embodiment to improve the sensitivity at the end of the angle of view without compromising the sensitivity at the center of the angle of view, and also possible to suppress shading in a captured image. Further, since the inclined principal ray directed toward the photodiode 21 in the pixel adjacent to a pixel in question is blocked by the corresponding pixel isolation and light blocking layer 42, color mixing can be suppressed in a captured image.

In the present embodiment, the image quality of a captured image can thus be improved.

Further, the present embodiment has been presented with reference to the case where the third pitch P3 increases in both the horizontal direction x and the vertical direction y with distance from the center toward the periphery of the imaging region PA, but the present embodiment is not limited thereto. The present embodiment may be configured in such a way that the third pitch P3 increases only in the horizontal direction x or the vertical direction y.

3. Third Embodiment

Device Configuration and Others

Figure 13:
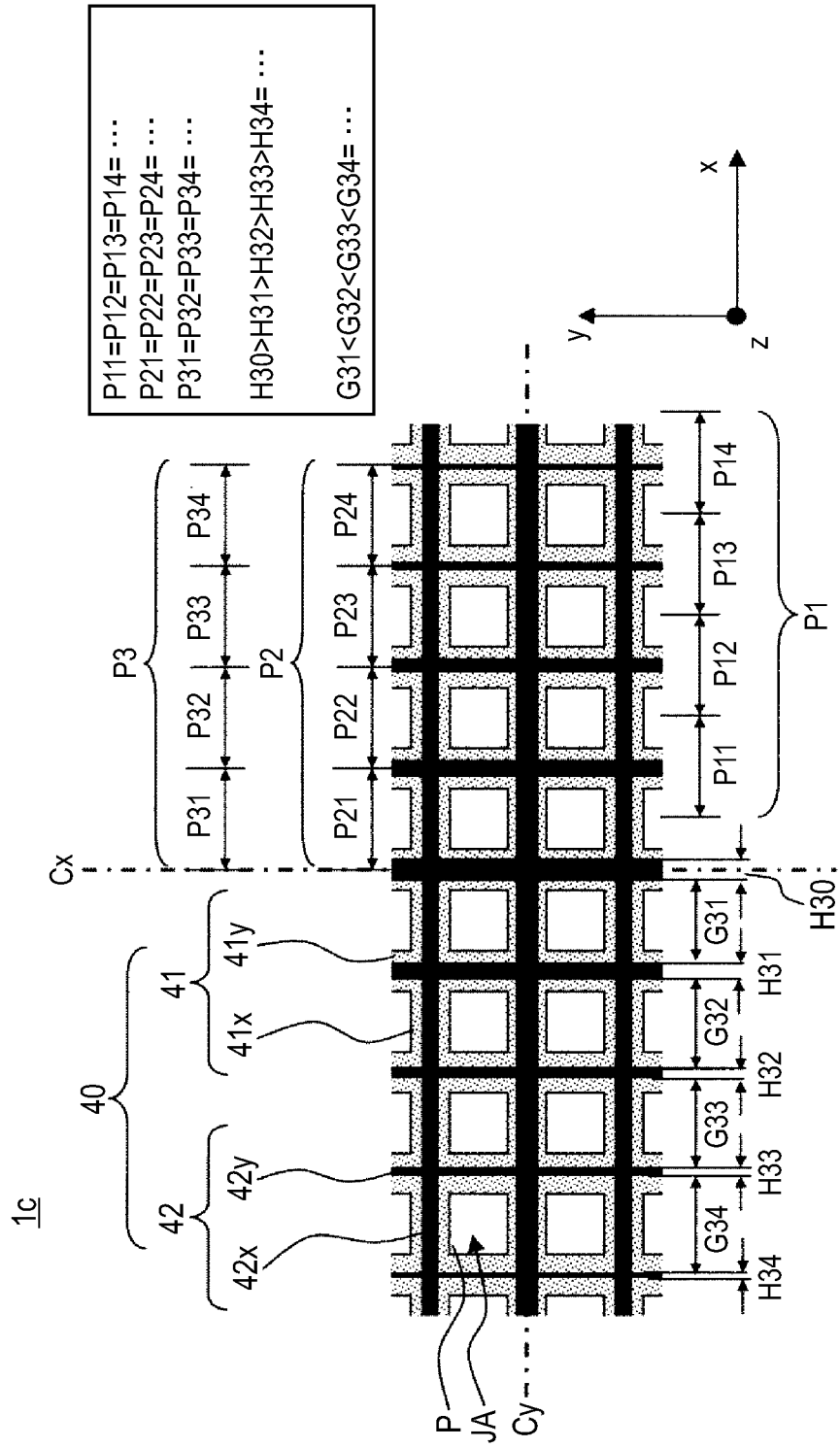
FIG. 13 shows a key portion of a solid-state imaging device in a third embodiment according to the invention.

FIG. 13 shows a key portion of a solid-state imaging device 1c in a third embodiment according to the invention.

FIG. 13 is an enlarged top view showing a key portion of the imaging region PA of the solid-state imaging device 1c. FIG. 13 shows a portion around the center Cy in the vertical direction y and the center Cx in the horizontal direction x in the imaging region PA, and the portion includes a plurality of photoelectric converters P arranged in the horizontal direction x.

As shown in FIG. 13, the solid-state imaging device 1c in the present embodiment differs from the solid-state imaging device 1b in the second embodiment in terms of the arrangement of the pixel isolation and light blocking layers 42. The present embodiment is the same as the second embodiment except the point described above and points associated therewith. No description of the redundant portions will be made.

Each of the pixel isolation and light blocking layers 42 includes portion 42x extending in the horizontal direction x and portions 42y extending in the vertical direction y, as shown in FIG. 13. A plurality of portions 42y, each of which extends in the vertical direction y in the corresponding pixel isolation and light blocking layer 42, are arranged at third pitches P3 in the horizontal direction x of the imaging region PA, as shown in FIG. 13.

In the present embodiment, the third pitches P3 are set to be the same as the first pitches P1 of the photoelectric converters P and the second pitches P2 of the electrode light blocking layers 41.

The portions 42y extending in the vertical direction y are, however, formed in the respective pixel isolation and light blocking layers 42 in such a way that the width of the portions 42y successively decreases with distance from the center Cy to the periphery of the imaging region PA.

Specifically, the disposed portions 42y satisfy the following equation (c1) when the widths are called H30, H31, H32, H33, H34, . . . counted from the center Cx toward the periphery in the horizontal direction x, as shown in FIG. 13.

$$H30>H31>H32>H33>H34>\ldots \quad (c1)$$

As a result, in the present embodiment, the widths G31, G32, G33, G34, . . . of the spaces between the portions 42y extending in the vertical direction y in the respective pixel isolation and light blocking layers 42 satisfy the following equation (c2). That is, the portions 42y widen with distance from the center Cx toward the periphery in the horizontal direction x in the imaging region PA.

$$G31<G32<G33<G34<\ldots \quad (c2)$$

The portions 42x extending in the horizontal direction x in the respective pixel isolation and light blocking layers 42 are provided in the same manner.

[Brief]

As described above, in the present embodiment, the pixel isolation and light blocking layers 42 are formed to include portions whose width decreases with distance from the center Cx toward the periphery of the imaging region PA. That is, the pixel isolation and light blocking layers 42 are formed to include portions in which the widths G31, G32, G33, G34, . . . of the spaces between the pixel isolation and light blocking layers 42 increase with distance from the center toward the periphery of the imaging region PA.

It is therefore possible in the present embodiment to improve the sensitivity at the end of the angle of view without compromising the sensitivity at the center of the angle of view, and also possible to suppress shading in a captured image. Further, since the inclined principal ray directed toward the photodiode 21 in the pixel adjacent to a pixel in question is blocked by the corresponding pixel isolation and light blocking layer 42, color mixing can be suppressed in a captured image.

In the present embodiment, the image quality of a captured image can thus be improved.

Further, the present embodiment has been presented with reference to the case where the widths of the pixel isolation and light blocking layers 42 in both the horizontal direction x and the vertical direction y vary with the position in the imaging region PA, but the present embodiment is not limited thereto. The present embodiment may be configured in such a way that one of the widths of the pixel isolation and light blocking layers 42 in the horizontal direction x and the vertical direction y is fixed, as in the second embodiment.

4. Fourth Embodiment

Device Configuration

Figure 14:
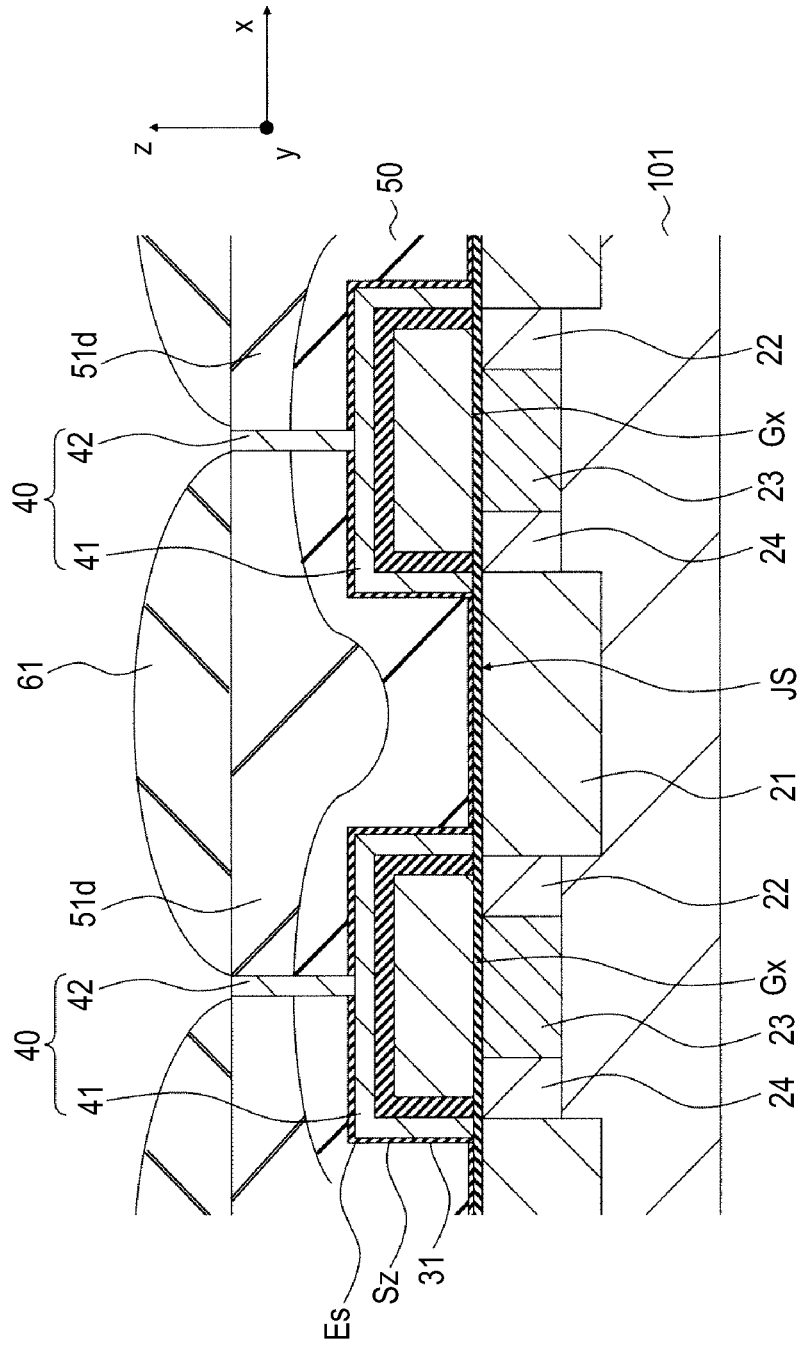
FIG. 14 shows a key portion of a solid-state imaging device in a fourth embodiment according to the invention.

FIG. 14 shows a key portion of a solid-state imaging device 1*d* in a fourth embodiment according to the invention.

FIG. 14 is a cross-sectional view, taken along the X direction, of a key portion of the pixels arranged in the imaging region PA shown in FIG. 2. FIG. 14 shows a central portion of the imaging region PA.

As shown in FIG. 14, the solid-state imaging device 1*d* in the present embodiment differs from the solid-state imaging device 1*a* in the first embodiment in terms of the shape of color filters 51*d*. Transparent layers 50 are further provided. The present embodiment is the same as the first embodiment except the point described above and points associated therewith. No description of the redundant portions will be made.

In the present embodiment, the transparent layers 50 are provided above the substrate 101, as shown in FIG. 14.

Specifically, the transparent layers 50 are formed over the respective photodiodes 21 and electrode light blocking layers 41 via the respective passivation films Es.

In the present embodiment, the transparent layers 50 are interposed between the pixel isolation and light blocking layers 42, as shown in FIG. 14. That is, the transparent layers 50 are buried in the portions partitioned by the pixel isolation and light blocking layers 42, like the color filters 51*d*.

The transparent layers 50 are configured to allow the incident light to pass therethrough toward the respective light receiving surfaces JS. For example, each of the transparent layers 50 is formed of a silicon oxide film into which boron and phosphorus are doped (BPSG film).

The color filters 51*d* are provided above the respective transparent layers 50, as shown in FIG. 14.

In the present embodiment, the surface of each of the color filters 51*d* that faces the light receiving surface JS of the corresponding photodiode 21 is convexly curved toward the light receiving surface JS and hence functions as a plano-convex lens whose lower side is the convex surface that focuses light on the light receiving surface JS.

Although not shown, the transparent layers 50 and the color filters 51*d* are formed in the periphery of the imaging region PA as well as the central portion thereof.

[Manufacturing Method]

A method for manufacturing the above solid-state imaging device 1*d* will be described below.

Figure 15:
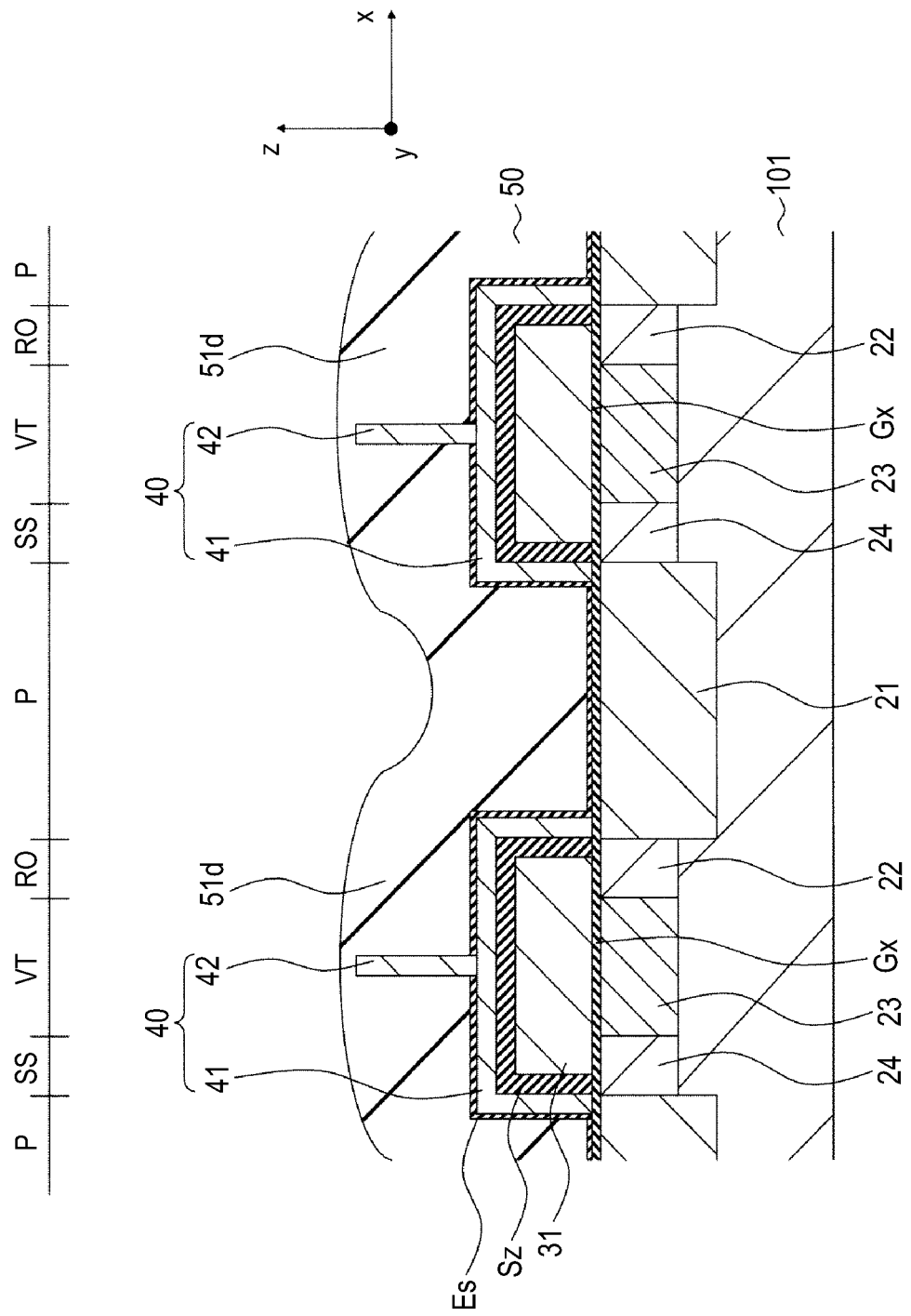
FIG. 15 shows a key portion formed in a step of a method for manufacturing the solid-state imaging device in the fourth embodiment according to the invention.
Figure 16:
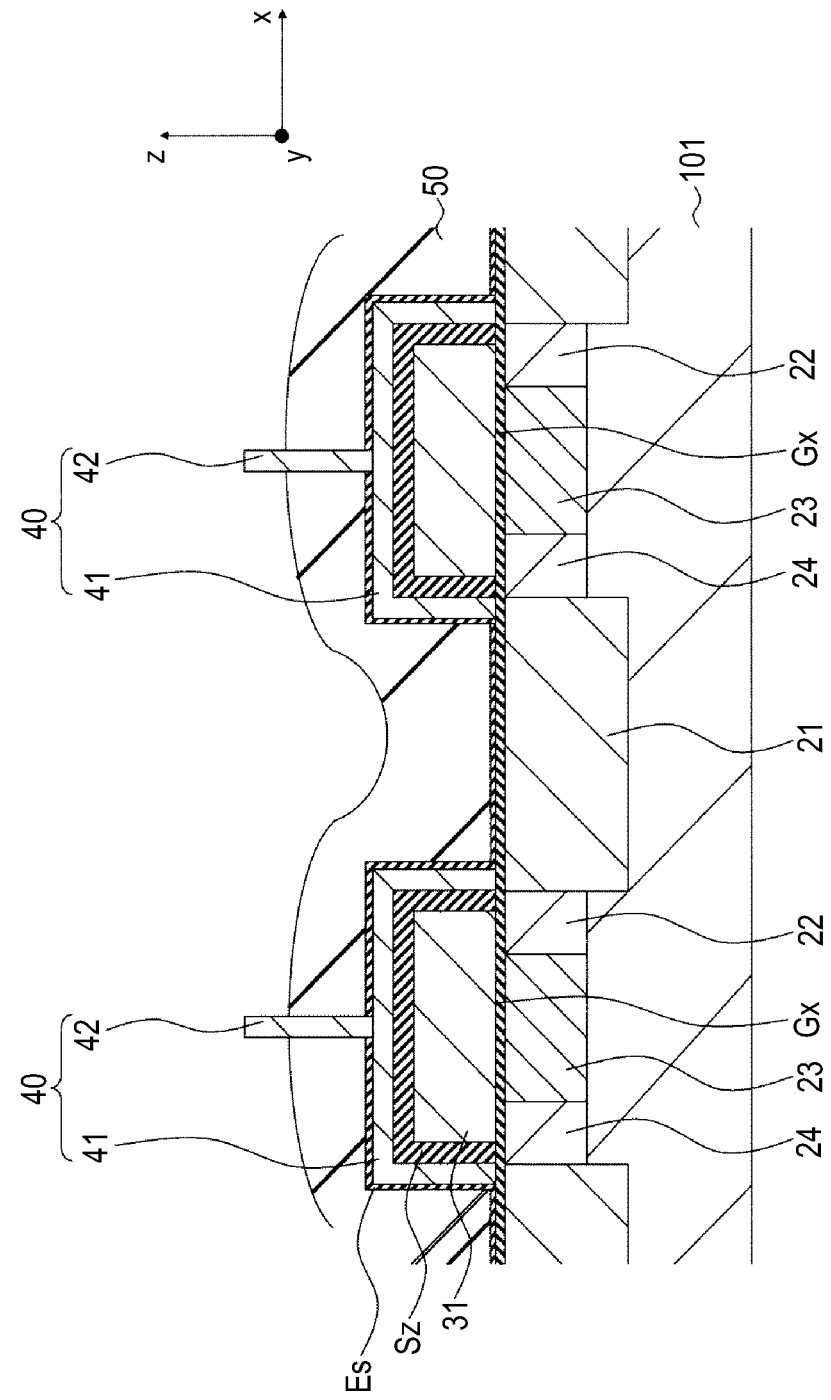
FIG. 16 shows the key portion formed in another step of the method for manufacturing the solid-state imaging device in the fourth embodiment according to the invention.
Figure 17:
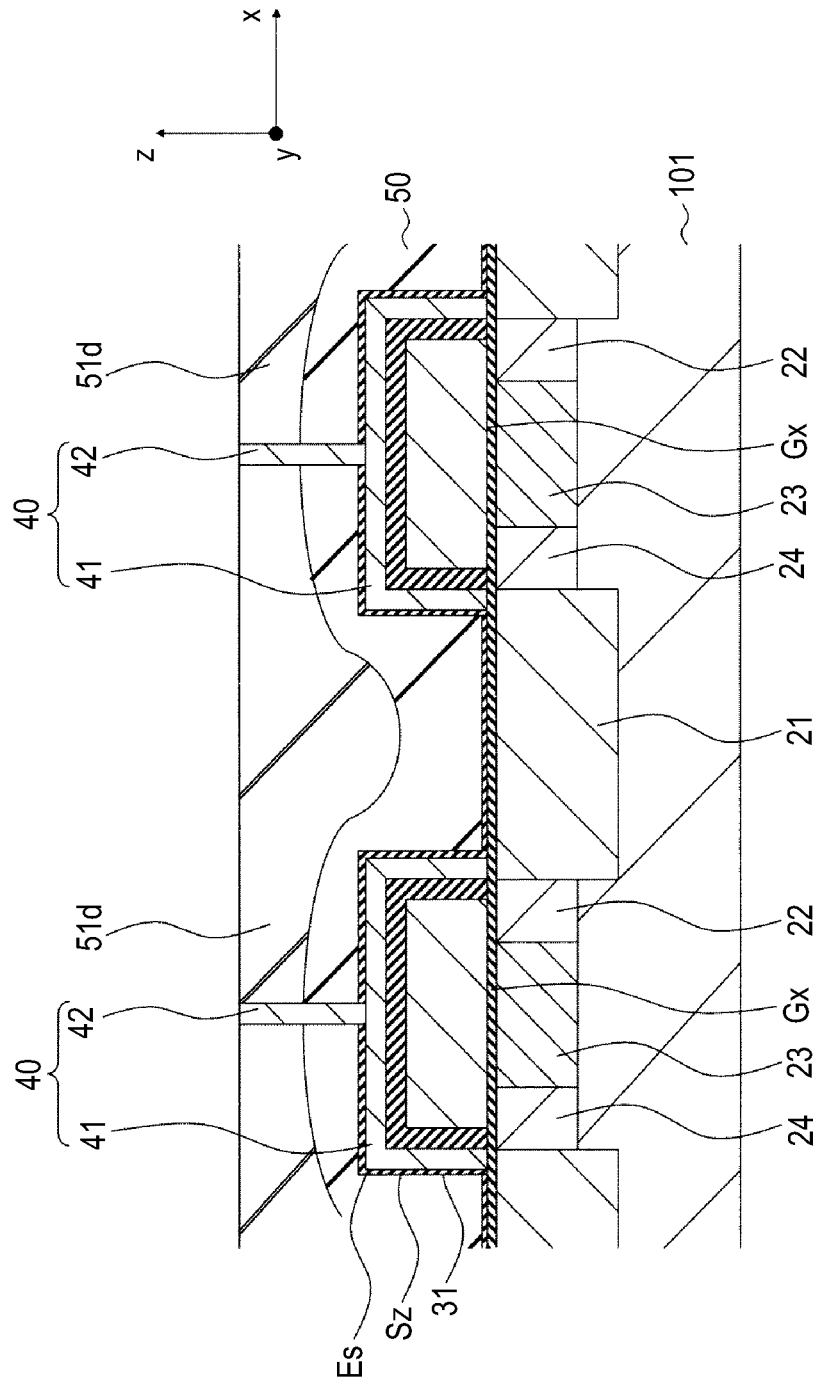
FIG. 17 shows the key portion formed in another step of the method for manufacturing the solid-state imaging device in the fourth embodiment according to the invention.

FIGS. 15, 16 and 17 show a key portion formed in the steps of the method for manufacturing the solid-state imaging device 1*d* in the fourth embodiment according to the invention. FIGS. 15, 16 and 17 show the same cross section as that shown in FIG. 14.

In the following description, the step of forming the transparent layers 50 and the color filters 51*d* will primarily be described.

(1) Formation of Transparent Layer 50

An initial transparent layer 50 is first formed, as shown in FIG. 15.

Before the formation of the initial transparent layer 50, the pixel isolation and light blocking layers 42 are formed, as shown in FIG. 8.

Thereafter, the initial transparent layer 50 is formed over the photodiodes 21 and the light blocking portions 40 via the passivation films Es, as shown in FIG. 15.

For example, the initial transparent layer 50 is formed by using CVD to form a BPSG film so that the pixel isolation and light blocking layers 42 are covered.

In this process, since the electrode light blocking layers 41 have been formed and jut out convexly from the substrate 101, recesses are formed in the initial transparent layer 50 in correspondence with the light receiving surfaces JS. Thereafter, a thermal reflow process is carried out to smoothly curve the surface of the initial transparent layer 50.

The curvature of each of the curved recesses can be adjusted as desired by appropriately setting the concentrations of the boron and phosphorus in the BPSG film, the temperature and the period of the reflow process, and other factors.

(2) Adjustment of Thickness of Initial Transparent Layer 50

The thickness of the initial transparent layer 50 is then adjusted, as shown in FIG. 16.

In the present embodiment, the thickness of the thus formed initial transparent layer 50 is adjusted by carrying out an etchback process.

Specifically, the thickness of the initial transparent layer 50 is adjusted in such a way that the top of each of the pixel isolation and light blocking layers 42 is exposed.

(3) Formation of Color Filters 51*d*

The color filters 51*d* are then formed, as shown in FIG. 17.

In the present embodiment, the color filters 51*d* are formed on the upper surfaces of the transparent layers 50 and buried between the pixel isolation and light blocking layers 42.

Specifically, the color filters 51*d* are formed by applying a photosensitive resin material containing a coloring agent.

The other portions are then provided. The solid-state imaging device 1*d* is thus completed.

[Brief]

In the present embodiment, since each of the color filters 51*d* is formed in such a way that it functions as a plano-convex lens whose lower side is the convex surface as described above, the color filter 51*d* focuses light on the corresponding light receiving surface JS.

When each of the color filters is not formed as a plano-convex lens whose lower side is the convex surface, principal rays incident at different angles have different optical path lengths through the color filters. In this case, sensitivity shading may occur across the angle of view in some cases.

The configuration in the present embodiment, however, can make the optical path lengths through the color filters 51*d* equal to each other even when the principal rays are incident at different angles.

Since the shading can be suppressed in the present embodiment, the image quality of a captured image can further be improved in a preferred manner.

5. Fifth Embodiment

Device Configuration

Figure 18:
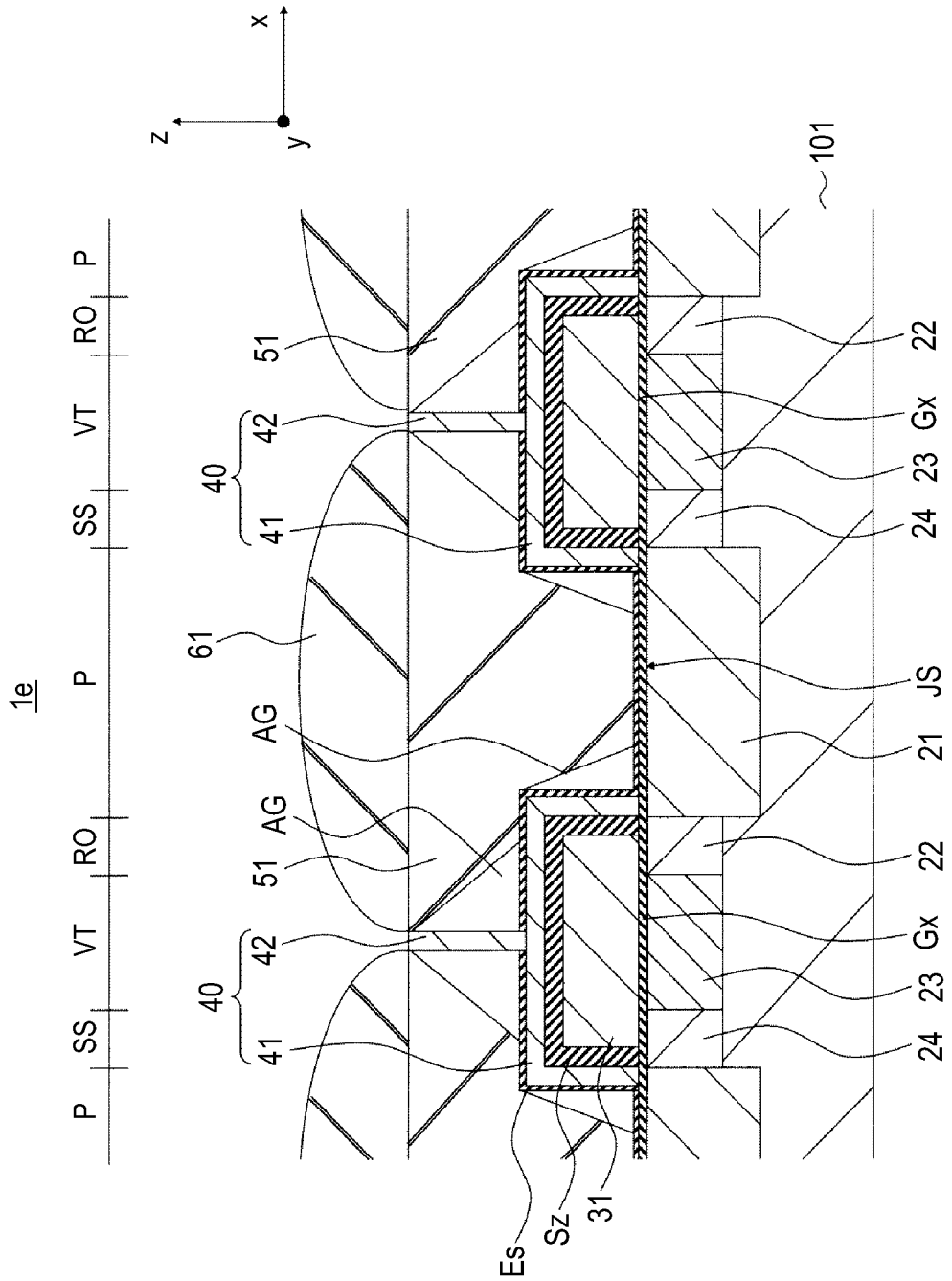
FIG. 18 shows a key portion of a solid-state imaging device in a fifth embodiment according to the invention.

FIG. 18 shows a key portion of a solid-state imaging device 1*e* in a fifth embodiment according to the invention.

FIG. 18 is a cross-sectional view, taken along the X direction, of a key portion of the pixels arranged in the imaging region PA shown in FIG. 2. FIG. 18 shows a central portion of the imaging region PA.

As shown in FIG. 18, the solid-state imaging device 1e in the present embodiment differs from the solid-state imaging device 1a in the first embodiment in terms of the shape of color filters 51e. The present embodiment is the same as the first embodiment except the point described above and points associated therewith. No description of the redundant portions will be made.

Each of the color filters 51e is configured to function as the core of a light guide that guides light to the corresponding light receiving surface JS with an air gap layer AG interposed between the color filter 51e and the corresponding light blocking portion 40, as shown in FIG. 18. In this case, the refractive index of the air gap layer AG is lower than that of the color filter 51e. That is, a light guide is formed on the light receiving surface JS with the color filter 51e being the core and the air gap layer AG being the clad.

In the present embodiment, each of the color filters 51e has a tapered shape whose width decreases in the depth direction z.

Although not shown, the air gap layer AG is also provided in the periphery of the imaging region PA as well as in the central portion thereof.

[Manufacturing Method]

A method for manufacturing the above solid-state imaging device 1e will be described below.

FIGS. 19, 20, 21, and 22 show a key portion formed in the steps of the method for manufacturing the solid-state imaging device 1e in the fifth embodiment according to the invention. FIGS. 19, 20, 21, and 22 show the same cross section as that shown in FIG. 18.

In the following description, the step of forming the color filters 51e will primarily be described.

(1) Formation of Polysilicon Film PL

Figure 19:
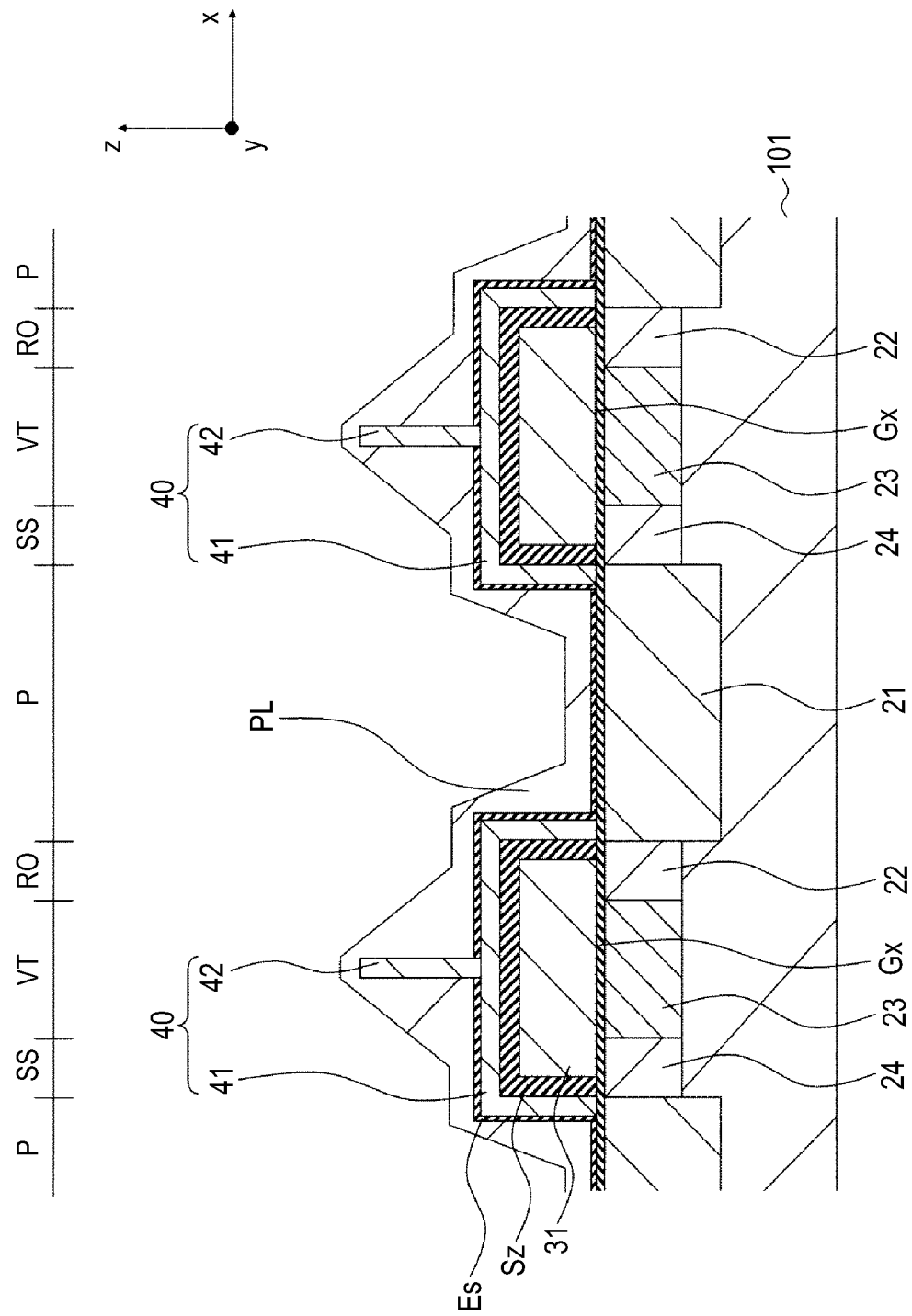
FIG. 19 shows a key portion formed in a step of a method for manufacturing the solid-state imaging device in the fifth embodiment according to the invention.

A polysilicon film PL is first formed, as shown in FIG. 19.

Before the formation of the polysilicon film PL, the pixel isolation and light blocking layers 42 are formed, as shown in FIG. 8.

Thereafter, the polysilicon film PL is formed over the photodiodes 21 and the light blocking portions 40 via the passivation films Es, as shown in FIG. 19.

For example, CVD is used to form the polysilicon film PL so that the pixel isolation and light blocking layers 42 are covered.

(2) Adjustment of Thickness of Polysilicon Film PL

Figure 20:
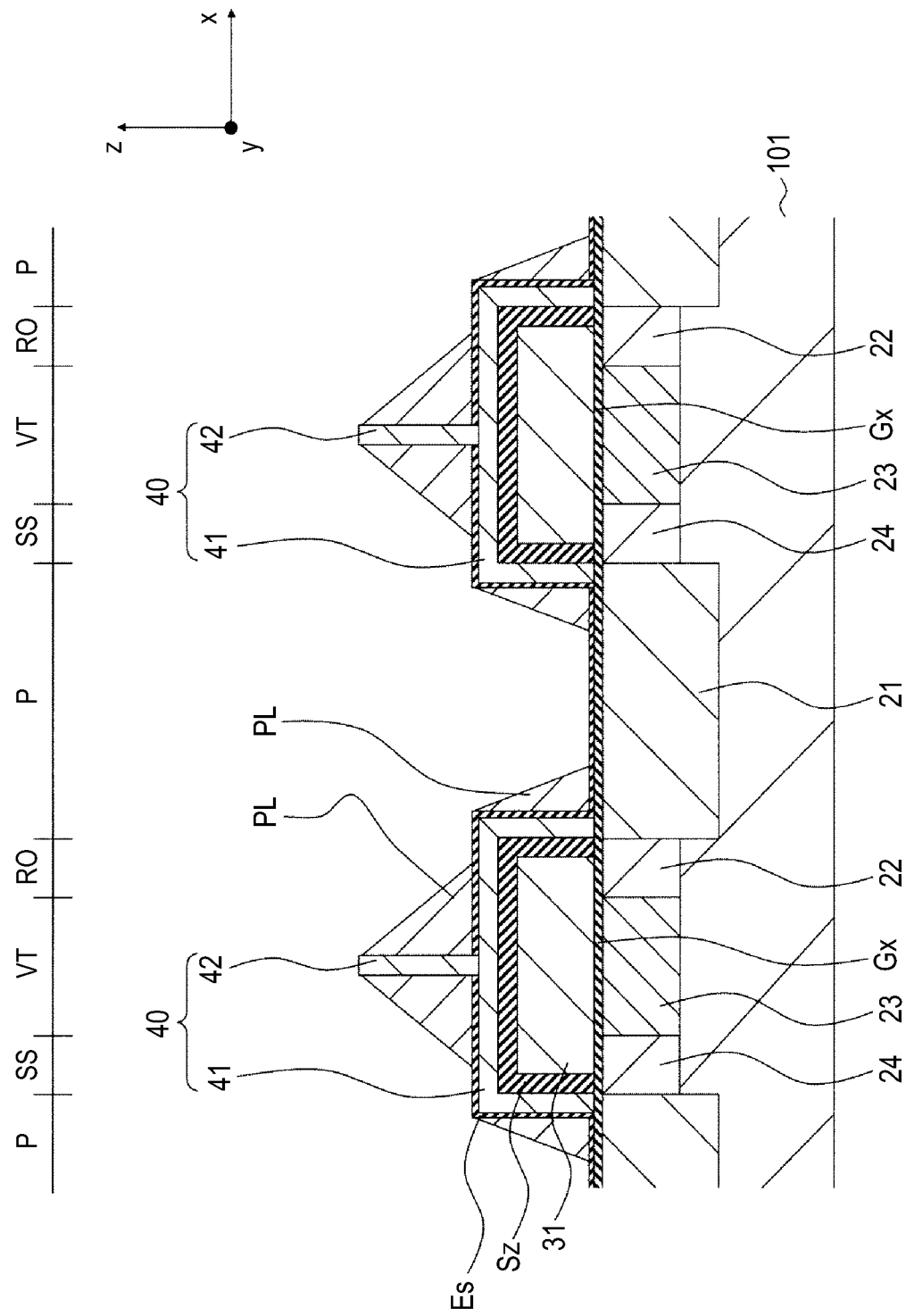
FIG. 20 shows the key portion formed in another step of the method for manufacturing the solid-state imaging device in the fifth embodiment according to the invention.

The thickness of the polysilicon film PL is then adjusted, as shown in FIG. 20.

In the present embodiment, the thickness of the thus formed polysilicon film PL is adjusted by carrying out an etchback process.

Specifically, the thickness of the polysilicon film PL is adjusted in such a way that the polysilicon film PL is left in the portions where the air gap layer AG described above (see FIG. 18) is formed.

(3) Formation of Color Filters 51e

Figure 21:
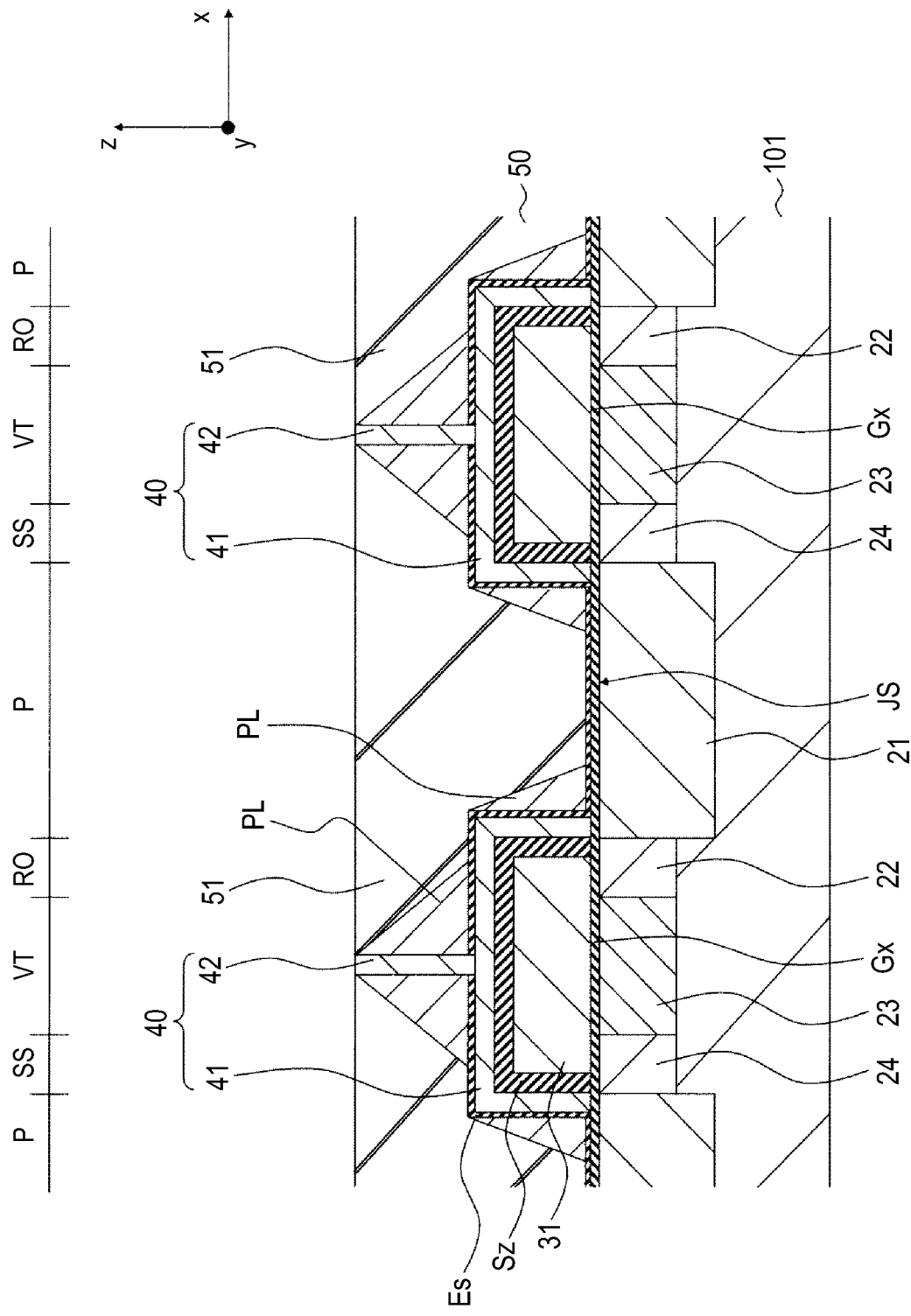
FIG. 21 shows the key portion formed in another step of the method for manufacturing the solid-state imaging device in the fifth embodiment according to the invention.

The color filters 51e are then formed, as shown in FIG. 21.

In the present embodiment, the color filters 51e are formed on the upper surfaces of the polysilicon films PL and buried between the pixel isolation and light blocking layers 42.

Specifically, the color filters 51e are formed by applying a photosensitive resin material containing a coloring agent.

(4) Formation of Air Gap Layers AG

Figure 22:
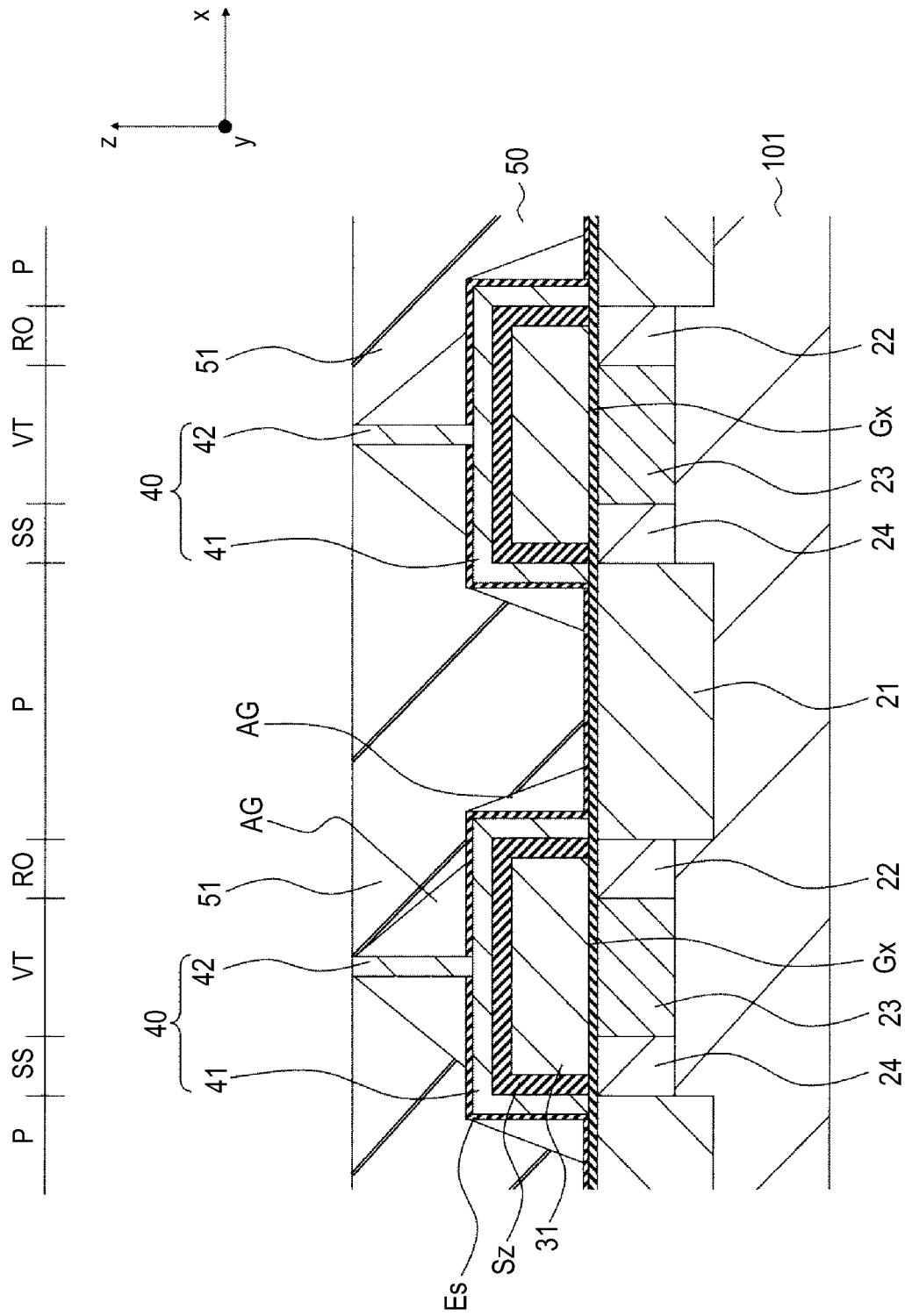
FIG. 22 shows the key portion formed in another step of the method for manufacturing the solid-state imaging device in the fifth embodiment according to the invention.

The air gap layers AG are then formed, as shown in FIG. 22.

In the present embodiment, the air gap layers AG are formed by removing the polysilicon films PL.

Figure 23:
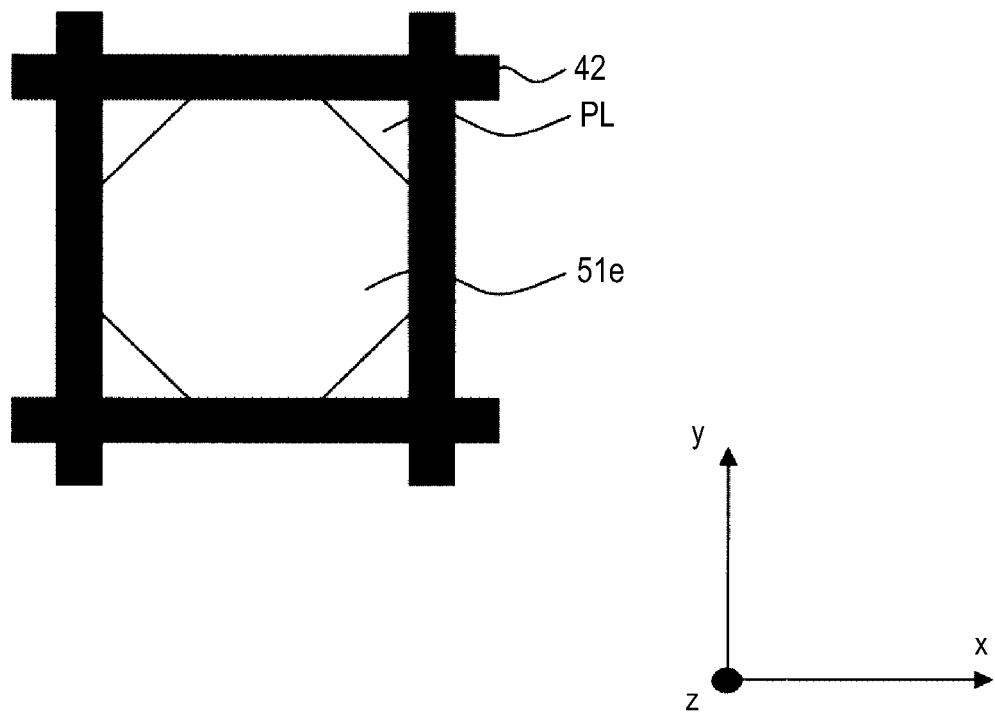
FIG. 23 shows a portion where a color filter is formed on the upper surface of a polysilicon film PL in the fourth and fifth embodiments according to the invention.

FIG. 23 shows a portion where any one of the color filters 51e is formed on the upper surface of the corresponding polysilicon film PL in the fifth embodiment according to the invention.

As shown in FIG. 23, at the intersections of the portions extending in the horizontal direction x and the portions extending in the vertical direction y in the pixel isolation and light blocking layer 42, the formed polysilicon film PL is thick and hence not covered with the color filter 51e. The surface of the polysilicon film PL is therefore exposed.

The polysilicon film PL is removed in a dry etching process through the portions where the surface of the polysilicon film PL is exposed, as shown in FIG. 23. As a result, the air gap layer AG, which is an air layer, is formed, as shown in FIG. 22.

The other portions are then provided. The solid-state imaging device 1e is thus completed.

[Brief]

In the present embodiment, since each of the color filters 51e is formed in such a way that it functions as a light guide as described above, the color filter 51e guides light to the corresponding light receiving surface JS.

When the color filters 51e are formed in the pixel isolation and light blocking layers 42, the light may be attenuated by the electrode light blocking layers 41 and the pixel isolation and light blocking layers 42, resulting in decrease in sensitivity in some cases. In particular, at the end of the angle of view where incident principal rays are inclined, light is incident on the light blocking portions 40 and hence the problem described above tends to occur, resulting in significant sensitivity shading.

According to the configuration in the present embodiment, however, the color filters 51e guide light to the respective light receiving surfaces JS.

Since the shading can be suppressed in the present embodiment, the image quality of a captured image can further be improved in a preferred manner.

6. Sixth Embodiment

Device Configuration

Figure 24:
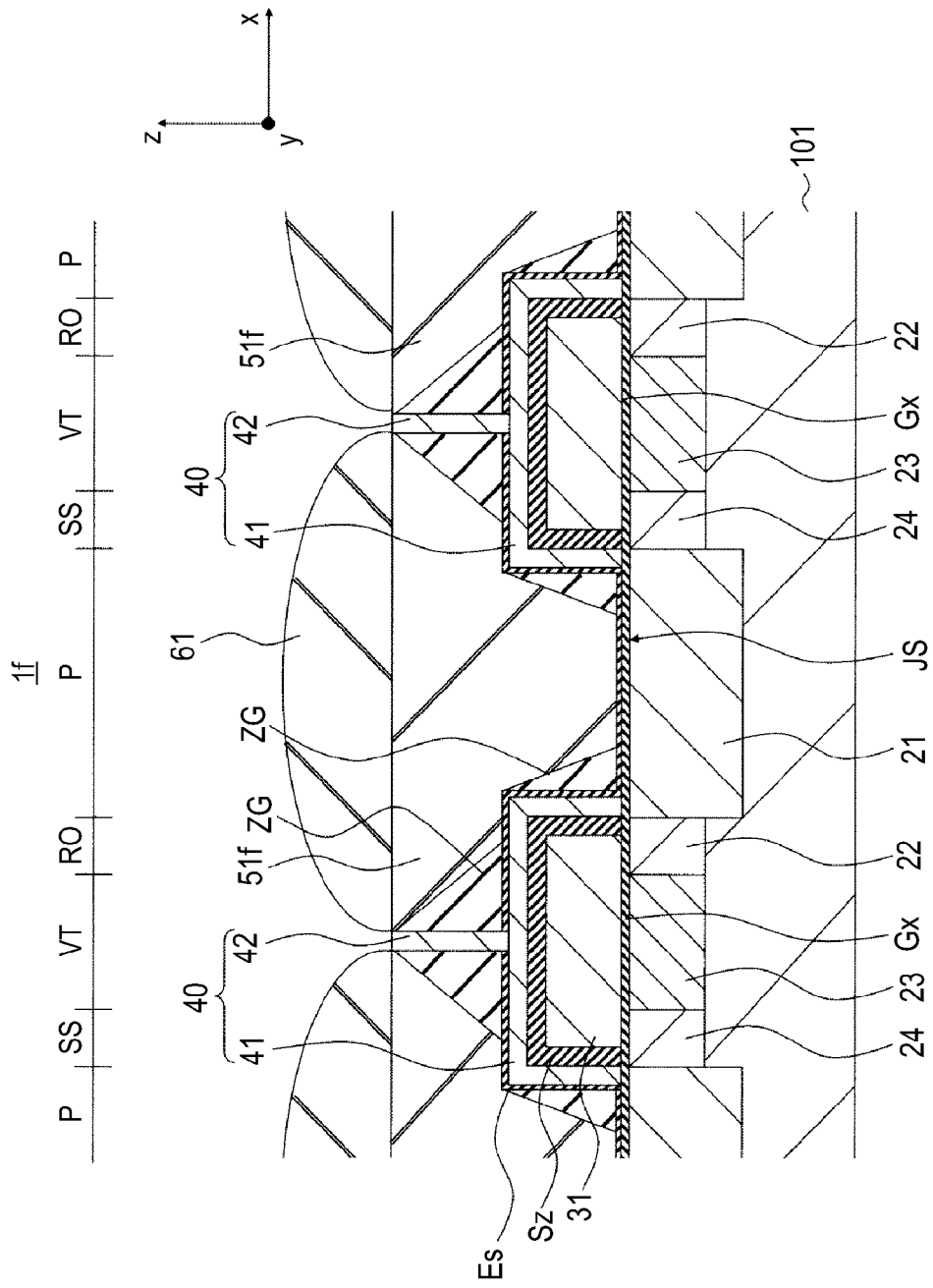
FIG. 24 shows a key portion of a solid-state imaging device in a sixth embodiment according to the invention.

FIG. 24 shows a key portion of a solid-state imaging device 1f in a sixth embodiment according to the invention.

FIG. 24 is a cross-sectional view, taken along the X direction, of a key portion of the pixels arranged in the imaging region PA shown in FIG. 2. FIG. 24 shows a central portion of the imaging region PA.

As shown in FIG. 24, in the present embodiment, the solid-state imaging device 1f has low refractive index layers ZG in place of the air gap layers AG. The present embodiment is the same as the fifth embodiment except the point described above and points associated therewith. No description of the redundant portions will be made.

Each color filter 51f is configured to function as the core of a light guide that guides light to the corresponding light receiving surface JS with the corresponding low refractive index layer ZG interposed between the color filter 51f and the corresponding light blocking portion 40, as shown in FIG. 24. In this case, the refractive index of the low refractive index layer ZG is lower than that of the color filter 51f. That is, a light guide is formed on the light receiving surface JS with the color filter 51f being the core and the low refractive index layer ZG being the clad.

In the present embodiment, each of the low refractive index layers ZG is formed of, for example, a silicon oxide film.

Although not shown, the low refractive index layer ZG is also provided in place of the air gap layer AG in the periphery of the imaging region PA as well as in the central portion thereof.

[Manufacturing Method]

A method for manufacturing the above solid-state imaging device 1f will be described below.

Figure 25:
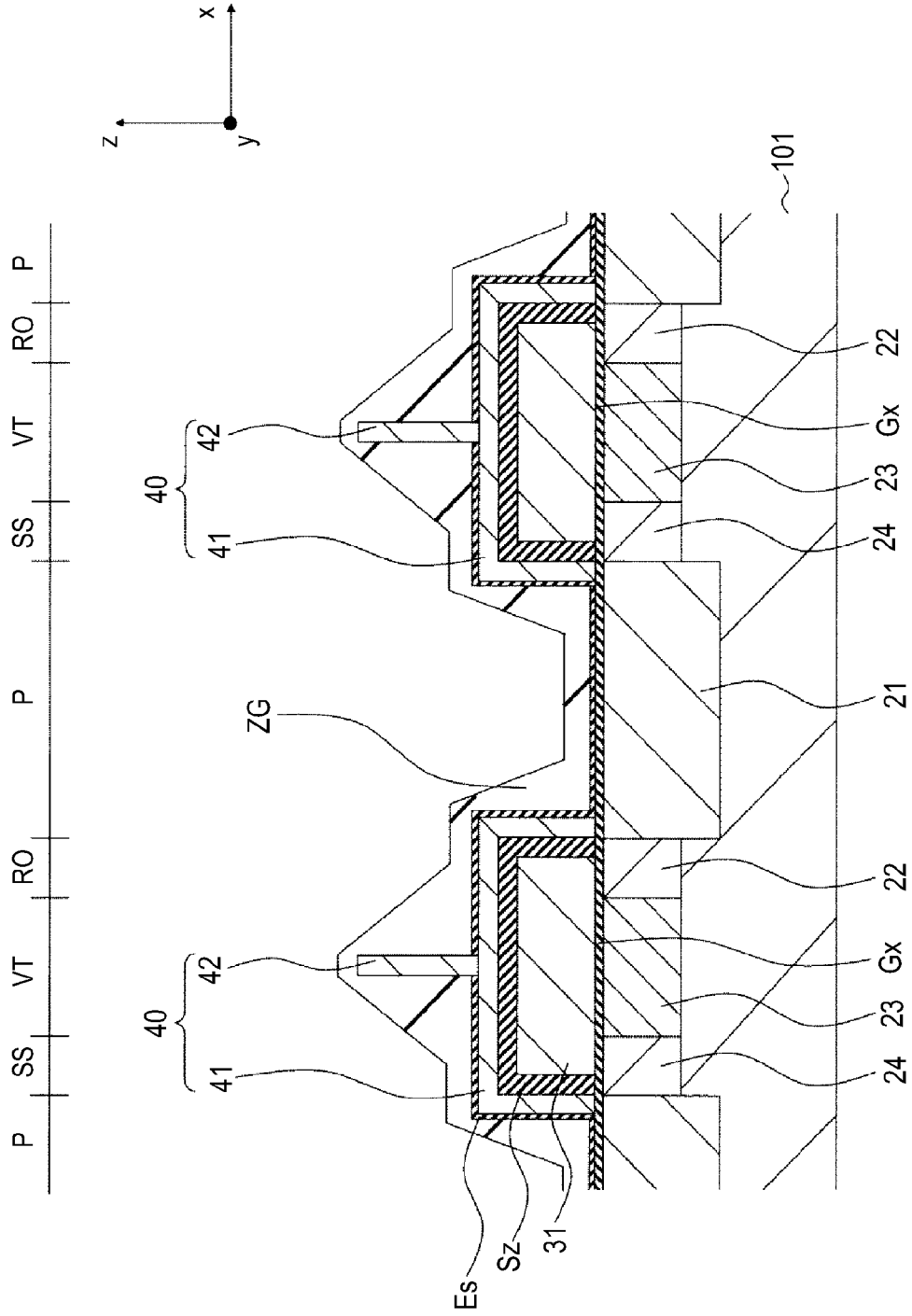
FIG. 25 shows a key portion formed in a step of a method for manufacturing the solid-state imaging device in the sixth embodiment according to the invention.
Figure 26:
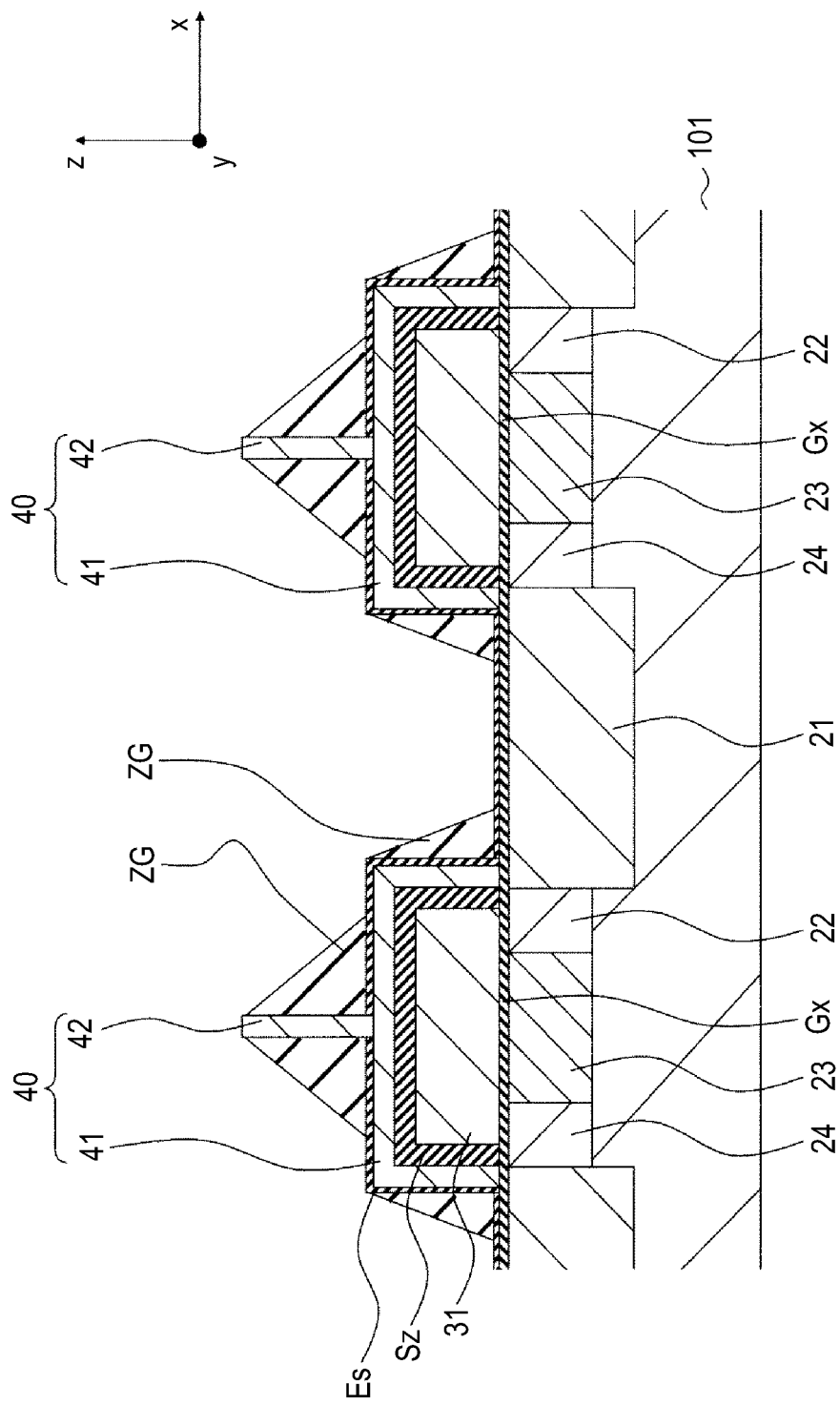
FIG. 26 shows the key portion formed in another step of the method for manufacturing the solid-state imaging device in the sixth embodiment according to the invention.
Figure 27:
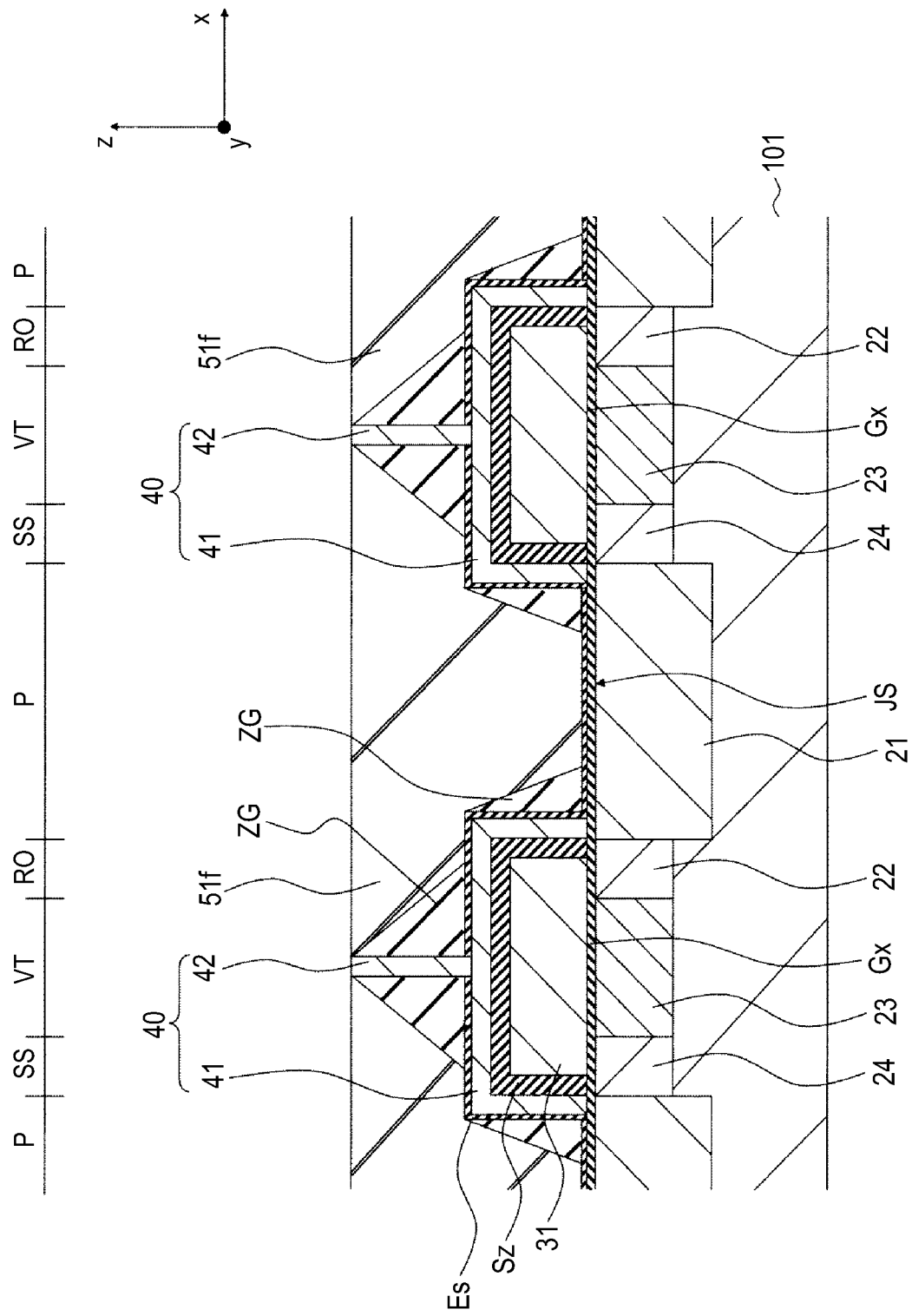
FIG. 27 shows the key portion formed in another step of the method for manufacturing the solid-state imaging device in the sixth embodiment according to the invention.

FIGS. 25, 26, and 27 show a key portion formed in the steps of the method for manufacturing the solid-state imaging device 1f in the sixth embodiment according to the invention. FIGS. 25, 26, and 27 show the same cross section as that shown in FIG. 24.

In the following description, the step of forming the color filters 51f will primarily be described.

(1) Formation of Low Refractive Index Layer ZG

An initial low refractive index layer ZG is first formed, as shown in FIG. 25.

Before the formation of the initial low refractive index layer ZG, the pixel isolation and light blocking layers 42 are formed, as shown in FIG. 8.

Thereafter, the initial low refractive index layer ZG is formed over the photodiodes 21 and the light blocking portions 40 via the passivation films Es, as shown in FIG. 25.

For example, the initial low refractive index layer ZG is formed by using CVD to form a silicon oxide film so that the pixel isolation and light blocking layers 42 are covered.

(2) Adjustment of Thickness of Initial Low Refractive Index Layer ZG

The thickness of the initial low refractive index layer ZG is then adjusted, as shown in FIG. 26.

In the present embodiment, the thickness of the thus formed initial low refractive index layer ZG is adjusted by carrying out an etchback process.

Specifically, the thickness is adjusted by carrying out the etchback process in such a way that the top of each of the pixel isolation and light blocking layers 42 is exposed.

(3) Formation of Color Filters 51f

The color filters 51f are then formed, as shown in FIG. 27.

In the present embodiment, the color filters 51f are formed on the upper surfaces of the low refractive index layers ZG and buried between the pixel isolation and light blocking layers 42.

Specifically, the color filters 51f are formed by applying a photosensitive resin material containing a coloring agent.

The other portions are then provided. The solid-state imaging device 1f is thus completed.

[Brief]

In the present embodiment, since each of the color filters 51f is formed in such a way that it functions as a light guide as described above, the color filter 51f guides light to the corresponding light receiving surface JS.

Since the shading can be suppressed in the present embodiment, the image quality of a captured image can further be improved in a preferred manner, as in the fifth embodiment.

7. Seventh Embodiment

Device Configuration and Others

Figure 28:
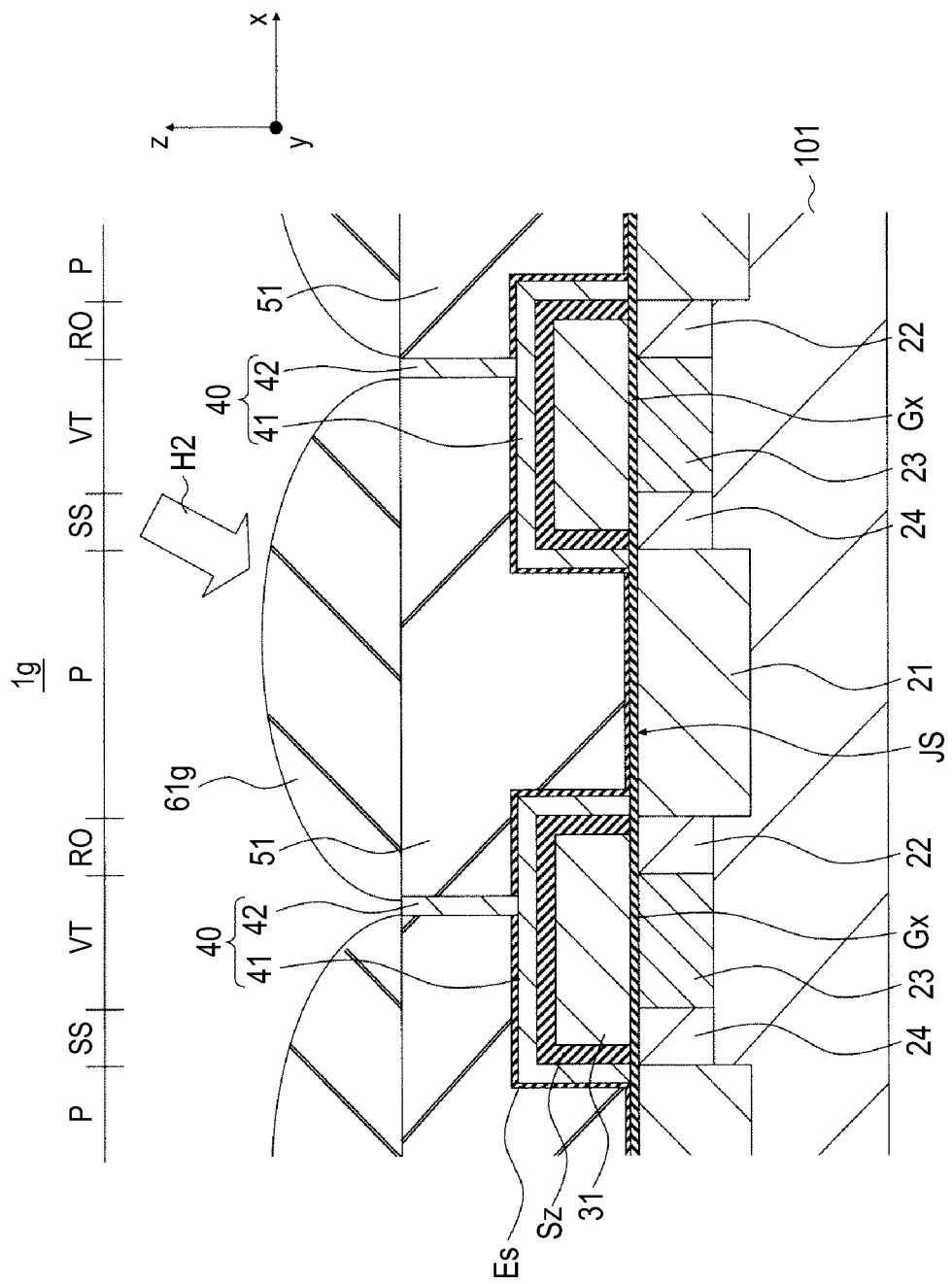
FIG. 28 shows a key portion of a solid-state imaging device in a seventh embodiment according to the invention.

FIG. 28 shows a key portion of a solid-state imaging device 1g in a seventh embodiment according to the invention.

FIG. 28 is a cross-sectional view, taken along the X direction, of a key portion of the pixels arranged in the imaging region PA shown in FIG. 2. FIG. 28 shows a peripheral portion of the imaging region PA. On the other hand, a central portion of the imaging region PA is the same as that shown in FIG. 10.

As shown in FIG. 28, the solid-state imaging device 1g in the present embodiment differs from the solid-state imaging device 1b in the second embodiment in terms of on-chip lenses 61g in the peripheral portion of the imaging region PA. The present embodiment is the same as the second embodiment except the point described above and points associated therewith. No description of the redundant portions will be made.

As seen by comparing FIG. 28 with FIG. 10 described above, each of the on-chip lenses 61g is formed in such a way that the thickness thereof increases with distance from the center toward the periphery of the imaging region PA. That is, the thickness is small at the center of the angle of view, whereas the thickness is large at the end of the angle of view.

[Brief]

As described above, in the present embodiment, the pixel isolation and light blocking layers 42 are formed in the same manner as in the second embodiment. That is, the pixel isolation and light blocking layers 42 are formed to include portions in which the widths G31, G32, G33, G34, ... of the spaces between the pixel isolation and light blocking layers 42 increase with distance from the center toward the periphery of the imaging region PA.

In addition to the above, each of the on-chip lenses 61g is formed in such a way that the thickness thereof increases with distance from the center toward the periphery of the imaging region PA, as described above.

It is therefore possible in the present embodiment to effectively focus light at the end of the angle of view and suppress shading in a captured image.

In the present embodiment, the image quality of a captured image can therefore be improved.

8. Others

The invention is not necessarily implemented in the manner as in the embodiments described above, but a variety of variations can be employed.

For example, while the above embodiments have been described with reference to the case where a CCD image sensor is used, a CCD image sensor is not necessarily used. For example, any other one of a variety of image sensors, such as a CMOS image sensor, can be used.

Further, in each of the three primary color filters, the thickness of the corresponding on-chip lens may be optimized by appropriately adjusting the thickness.

While the above embodiments have been described with reference to the case where the invention is applied to a camera, the invention is not necessarily applied to a camera. The invention may be applied to a scanner, a copier, or any other electronic apparatus including a solid-state imaging device.

In addition to the above, the spirit of the invention may be combined as appropriate.

In the embodiments described above, the solid-state imaging devices 1, 1b, 1c, 1d, 1e, 1f, and 1g correspond to the solid-state imaging device according to an embodiment of the invention. In the embodiments described above, the substrate 101 corresponds to the substrate according to an embodiment of the invention. In the embodiments described above, the imaging region PA and the imaging surface PS correspond to the imaging surface according to an embodiment of the invention. In the embodiments described above, the light receiving surface JS corresponds to the light receiving surface according to an embodiment of the invention. In the embodiments described above, the photodiode 21 corresponds to the photoelectric conversion element according to an embodiment of the invention. In the embodiments described above, the transfer electrode 31 corresponds to the electrode according to an embodiment of the invention. In the embodiments described above, the light blocking portion 40 corresponds to the light blocking portion according to an embodiment of the invention. In the embodiments described above, the extending portions 41x and 41y in the electrode light blocking layers 41 correspond to the electrode light blocking portions according to an embodiment of the invention. In the embodiments described above, the extending portions 42x and 42y in the pixel isolation and light blocking layer 42 correspond to the pixel isolation and light blocking portion according to an embodiment of the invention. In the embodiments described above, the first pitch P1 corresponds to the first pitch according to an embodiment of the invention. In the embodiments described above, the second pitch P2 corresponds to the second pitch according to an embodiment of the invention. In the embodiments described above, the third pitch P3 corresponds to the third pitch according to an embodiment of the invention. In the embodiments described above, the color filters 51, 51d, 51e, and 51f correspond to the color filter according to an embodiment of the invention. In the embodiments described above, the on-chip lenses 61 and 61g correspond to the on-chip lens according to an embodiment of the invention. In the embodiments described above, the camera 200 corresponds to the electronic apparatus according to an embodiment of the invention.

The present application contains subject matter related to that disclosed in Japanese Priority Patent Application JP 2009-035761 filed in the Japan Patent Office on Feb. 18, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
    a pixel area having a plurality of pixels on an imaging surface of a substrate, respective ones of the pixels including a photoelectric conversion element and an on-chip lens being disposed above the photoelectric conversion element; and
    a plurality of light blocking portions interposed between the photoelectric conversion elements arranged on the imaging surface, wherein
    the light blocking portions are configured such that a width between a pair of neighboring photoelectric conversion elements decreases with a distance from a center of the imaging surface toward a periphery of the imaging surface.

2. The solid-state imaging device according to claim 1, further comprising a color filter being disposed between the photoelectric conversion element and the on-chip lens.

3. The solid-state imaging device according to claim 2, further comprising
    a low refractive index layer being disposed between the color filter and the corresponding light blocking portion, wherein
    the low refractive index layer has a lower refractive index than the color filter.

4. The solid-state imaging device according to claim 3, wherein a material of the low refractive index layer is air.

5. The solid-state imaging device according to claim 1, wherein respective photoelectric conversion elements are configured to produce a signal charge in response to a light incident thereon.

6. The solid-state imaging device according to claim 1, wherein
    the on-chip lens comprises a plurality of individual on-chip lenses,
    the individual on-chip lenses are configured such that a thickness of respective individual on-chip lenses increases with a distance from the center of the imaging surface toward the periphery of the imaging surface.

7. An electronic apparatus comprising the solid-state imaging device according to claim 1.

8. The electronic apparatus according to claim 7, further comprising a color filter being disposed between the photoelectric conversion element and the on-chip lens.

9. The electronic apparatus according to claim 8, further comprising
    a low refractive index layer being disposed between the color filter and the corresponding light blocking portion, wherein
    the low refractive index layer has a lower refractive index than the color filter.

10. The electronic apparatus according to claim 9, wherein
    the on-chip lens comprises a plurality of individual on-chip lenses,
    the individual on-chip lenses are configured such that a thickness of respective individual on-chip lenses increases with a distance from the center of the imaging surface toward the periphery of the imaging surface.

11. The electronic apparatus according to claim 7, wherein respective photoelectric conversion elements are configured to produce a signal charge in response to a light incident thereon.

12. A method of manufacturing a solid-state imaging device comprising:
    providing a pixel area having a plurality of pixels on an imaging surface of a substrate, respective ones of the pixels including a photoelectric conversion element and an on-chip lens being disposed above the photoelectric conversion element; and
    interposing a plurality of light blocking portions between the photoelectric conversion elements arranged on the imaging surface, wherein
    the light blocking portions are configured such that a width between a pair of neighboring photoelectric conversion elements decreases with a distance from a center of the imaging surface toward a periphery of the imaging surface.

13. The method of manufacturing a solid-state imaging device according to claim 12, further comprising disposing a color filter between the photoelectric conversion element and the on-chip lens.

14. The method of manufacturing a solid-state imaging device according to claim 13, further comprising
    disposing a low refractive index layer between the color filter and the corresponding light blocking portion, wherein
    the low refractive index layer has a lower refractive index than the color filter.

15. The method of manufacturing a solid-state imaging device according to claim 14, wherein a material of the low refractive index layer is air.

16. The method of manufacturing a solid-state imaging device according to claim 12, wherein respective photoelectric conversion elements are configured to produce a signal charge in response to a light incident thereon.

17. The method of manufacturing a solid-state imaging device according to claim 12, wherein
- the on-chip lens comprises a plurality of individual on-chip lenses,
- the individual on-chip lenses are configured such that a thickness of respective individual on-chip lenses increases with a distance from the center of the imaging surface toward the periphery of the imaging surface.

* * * * *